US011794444B2

(12) United States Patent
Tsukao et al.

(10) Patent No.: US 11,794,444 B2
(45) Date of Patent: Oct. 24, 2023

(54) ANISOTROPIC CONDUCTIVE FILM

(71) Applicant: DEXERIALS CORPORATION, Tokyo (JP)

(72) Inventors: Reiji Tsukao, Utsunomiya (JP); Yasushi Akutsu, Utsunomiya (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 16/085,515

(22) PCT Filed: Apr. 25, 2017

(86) PCT No.: PCT/JP2017/016345
§ 371 (c)(1),
(2) Date: Sep. 14, 2018

(87) PCT Pub. No.: WO2017/191781
PCT Pub. Date: Nov. 9, 2017

(65) Prior Publication Data
US 2019/0035763 A1    Jan. 31, 2019

(30) Foreign Application Priority Data

May 5, 2016 (JP) ................ 2016-092903
Apr. 24, 2017 (JP) ................ 2017-085744

(51) Int. Cl.
*B32B 5/16* (2006.01)
*B32B 27/20* (2006.01)

(52) U.S. Cl.
CPC ............... *B32B 5/16* (2013.01); *B32B 27/20* (2013.01); *B32B 2260/025* (2013.01); *B32B 2260/046* (2013.01)

(58) Field of Classification Search
None
See application file for complete search history.

(56) References Cited

U.S. PATENT DOCUMENTS

| 4,209,481 | A | 6/1980 | Kashira et al. | |
| 10,121,756 | B2* | 11/2018 | Shinohara | ............... H01B 1/22 |
| 2001/0008169 | A1 | 7/2001 | Connell et al. | |
| 2009/0090545 | A1* | 4/2009 | Usui | ............... H01L 24/83 |
| | | | | 156/60 |
| 2015/0208511 | A1* | 7/2015 | Ishimatsu | ............... H01L 24/32 |
| | | | | 156/229 |
| 2015/0319867 | A1 | 11/2015 | Sato | |
| 2016/0270225 | A1 | 9/2016 | Shinohara | |
| 2017/0103959 | A1 | 4/2017 | Akutsu et al. | |

FOREIGN PATENT DOCUMENTS

| JP | S53-033390 A | 3/1978 | |
| JP | H04-061398 A | 2/1992 | |
| JP | H09-320345 A | 12/1997 | |
| JP | 2002-519473 A | 7/2002 | |
| JP | 2007-019550 A | 1/2007 | |
| JP | 2007-080522 A | 3/2007 | |
| JP | 2009-076431 A | 4/2009 | |
| JP | 2010-019672 A | 1/2010 | |
| JP | 2010-251337 A | 11/2010 | |
| JP | 4887700 B2 | 2/2012 | |
| JP | 2014-044948 A | 3/2014 | |
| JP | 2014-063729 A | 4/2014 | |
| JP | 2015-032500 A | 2/2015 | |
| JP | 2015-079586 A | 4/2015 | |
| JP | 2015-201435 A | 11/2015 | |
| JP | 2015-232660 A | 12/2015 | |
| JP | 2016-015205 A | 1/2016 | |
| JP | 2016-066573 A | 4/2016 | |
| JP | 2016-085983 A | 5/2016 | |
| KR | 10-2001-0053298 A | 6/2001 | |
| WO | 97/45893 A1 | 12/1997 | |
| WO | WO-2013002336 A1 * | 1/2013 | ............ F23D 14/84 |
| WO | 2016/002336 A1 | 1/2016 | |

OTHER PUBLICATIONS

Feb. 20, 2020 Office Action issued Korean Patent Application No. 10-2018-7021398.
May 25, 2020 Office Action issued in Chinese Patent Application No. 201780025115.8.
Jun. 6, 2017 International Search Report issued in International Patent Application No. PCT/JP2017/016345.
Jun. 6, 2017 Written Opinion of the International Searching Authority issued in International Patent Application No. PCT/JP2017/016345.
May 22, 2018 Written Opinion of the International Preliminary Examining Authority issued in International Patent Application No. PCT/JP2017/016345.
Sep. 5, 2018 International Preliminary Report on Patentability issued in International Patent Application No. PCT/JP2017/016345.
Jul. 29, 2019 Office Action issued in Chinese Patent Application No. 201780025115.8.
Aug. 19, 2019 Office Action issued in Korean Patent Application No. 10-2018-7021398.
Apr. 8, 2020 Office Action issued in Korean Patent Application No. 10-2018-7021398.

(Continued)

*Primary Examiner* — Cheng Yuan Huang
(74) *Attorney, Agent, or Firm* — Oliff PLC

(57) ABSTRACT

An anisotropic conductive film capable of accommodating bumps with a narrow pitch and reducing the number density of conductive particles. In an anisotropic conductive film, conductive particles are disposed in an insulating resin binder as follows. Specifically, the conductive particles are rows of conductive particles arranged in single rows with spacing therebetween; and repeating units of conductive particles formed by juxtaposition of different numbers of conductive particles are disposed repeatedly over the entire surface of the anisotropic conductive film.

19 Claims, 13 Drawing Sheets

(56) References Cited

OTHER PUBLICATIONS

Dec. 29, 2020 Office Action issued in Taiwanese Patent Application No. 106114401.
Mar. 9, 2021 Office Action issued in Japanese Patent Application No. 2017-085744.
Nov. 16, 2021 Decision of Refusal issued in Japanese Patent Application No. 2017-085744.
Aug. 4, 2021 Office Action issued in Korean Patent Application No. 10-2021-7011350.
Apr. 13, 2022 Reconsideration Report by Examiner before Appeal issued in Japanese Patent Application No. 2017-085744.
Jun. 27, 2022 Office Action issued in Korean Patent Application No. 10-2021-7011350.
Jan. 4, 2023 Office Action issued in Japanese Patent Application No. 2017-085744.
May 30, 2023 Office Action issued in Japanese Patent Application No. 2022-021048.
Apr. 16, 2023 Office Action issued in Korean Patent Application No. 10-2021-7011350.
Aug. 9, 2023 Office Action issued in Korean Patent Application No. 10-2021-7011350.

\* cited by examiner

[FIG. 1A]
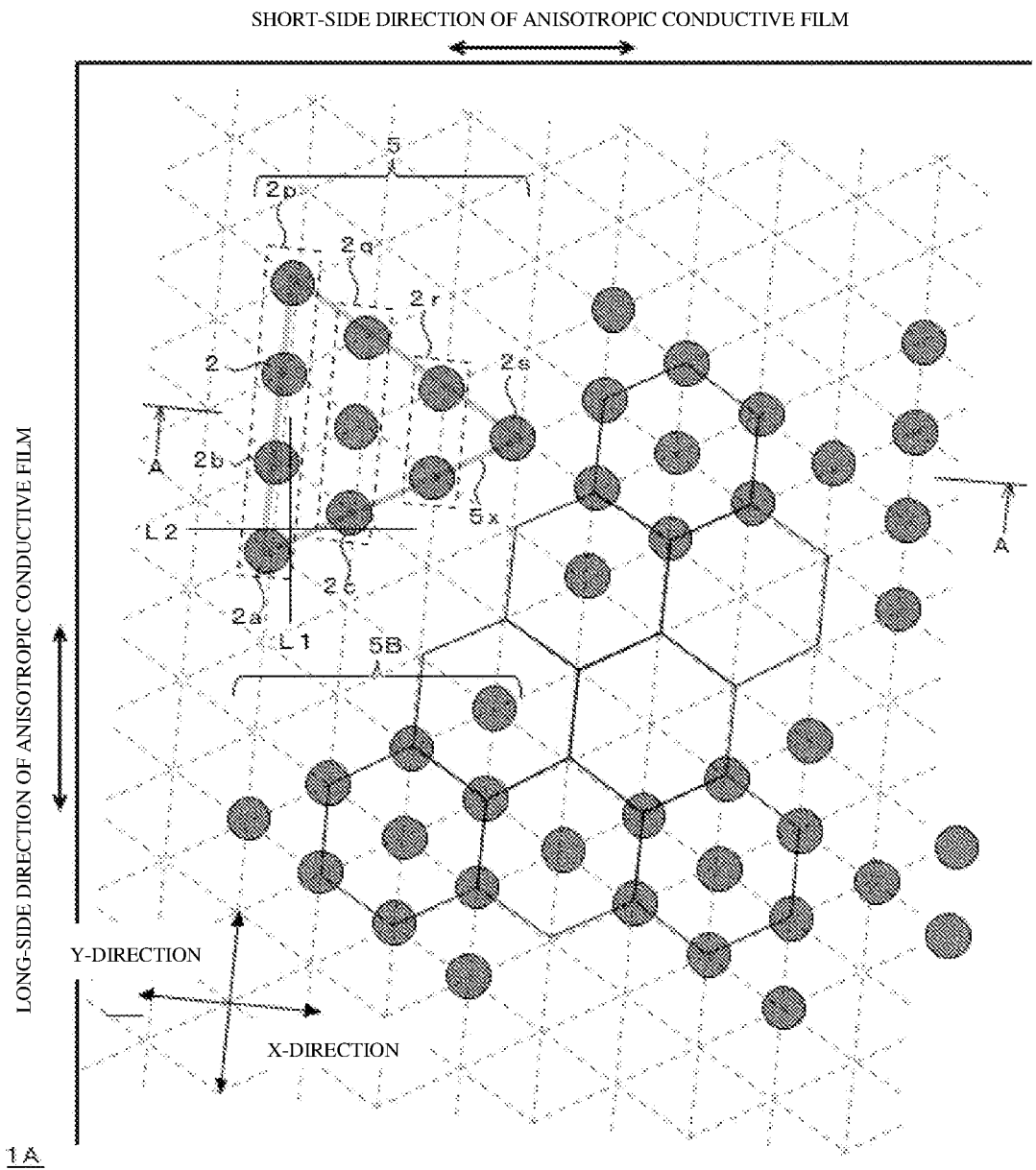
[FIG. 1B]
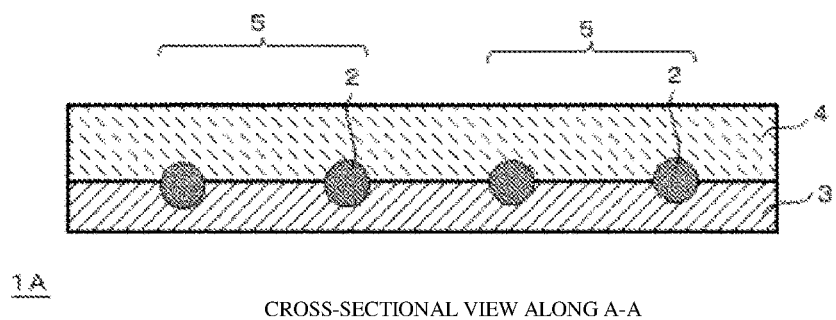
CROSS-SECTIONAL VIEW ALONG A-A

[FIG. 2]
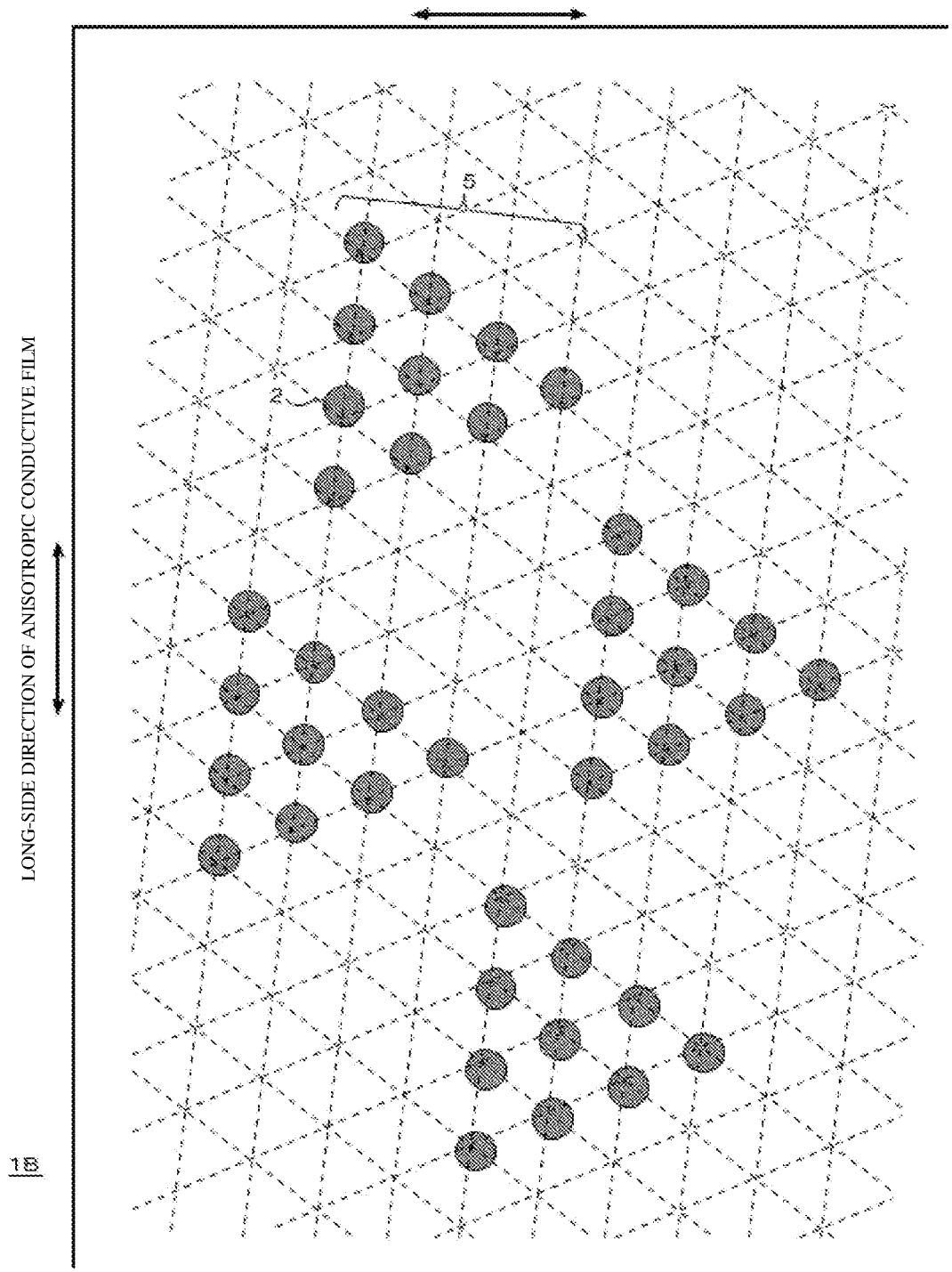

[FIG. 3]
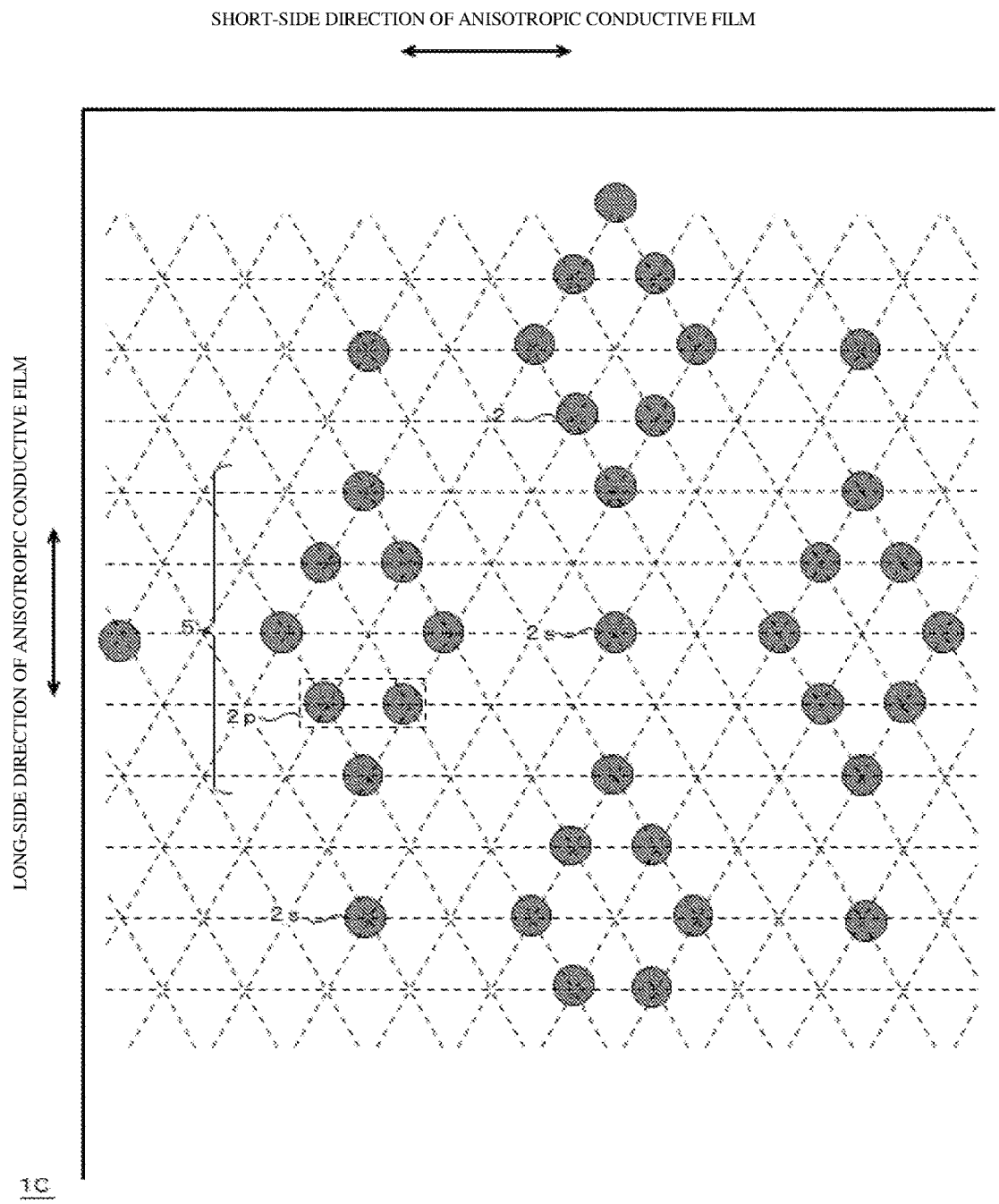

[FIG. 4]
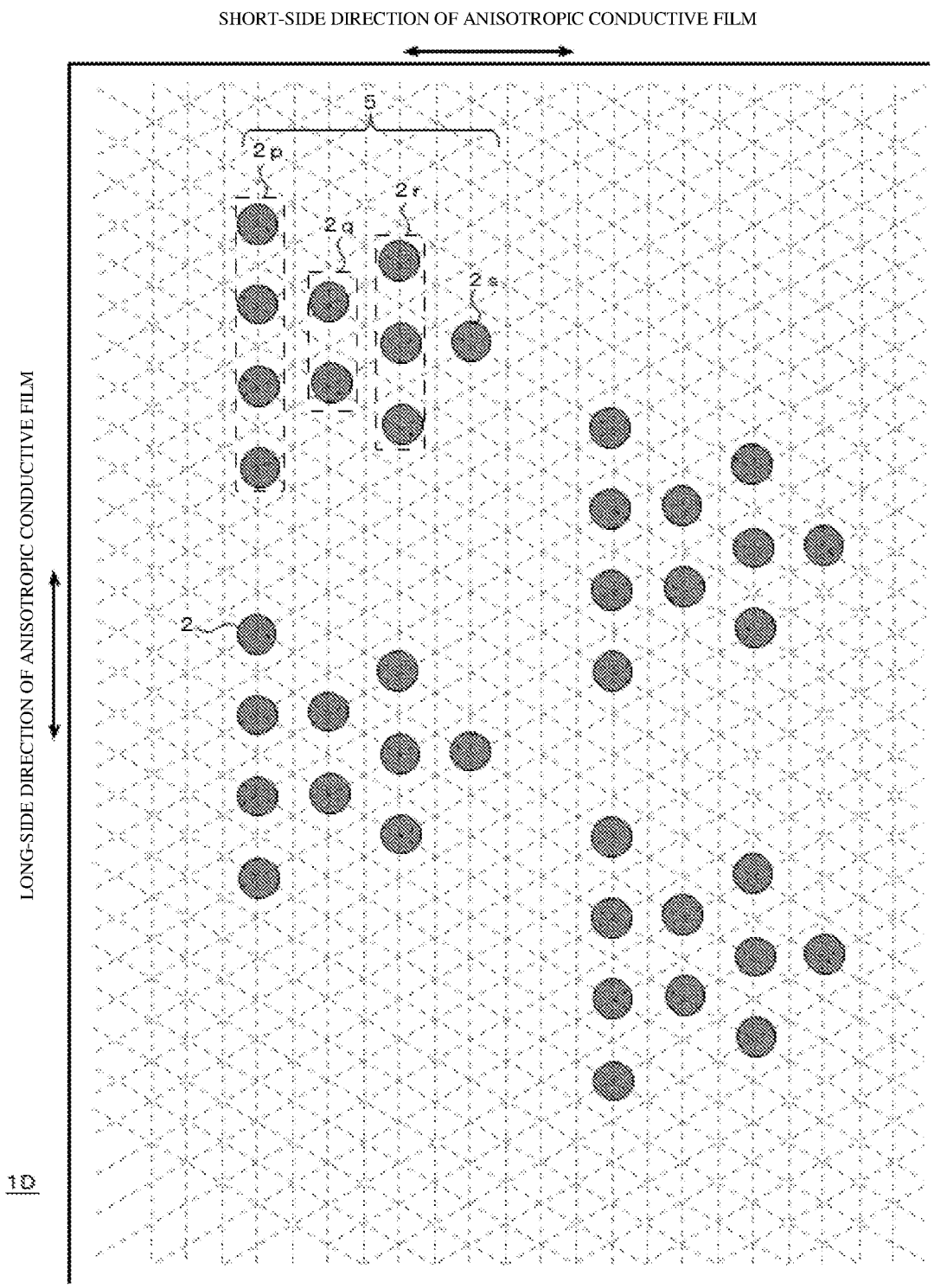

[FIG. 5]
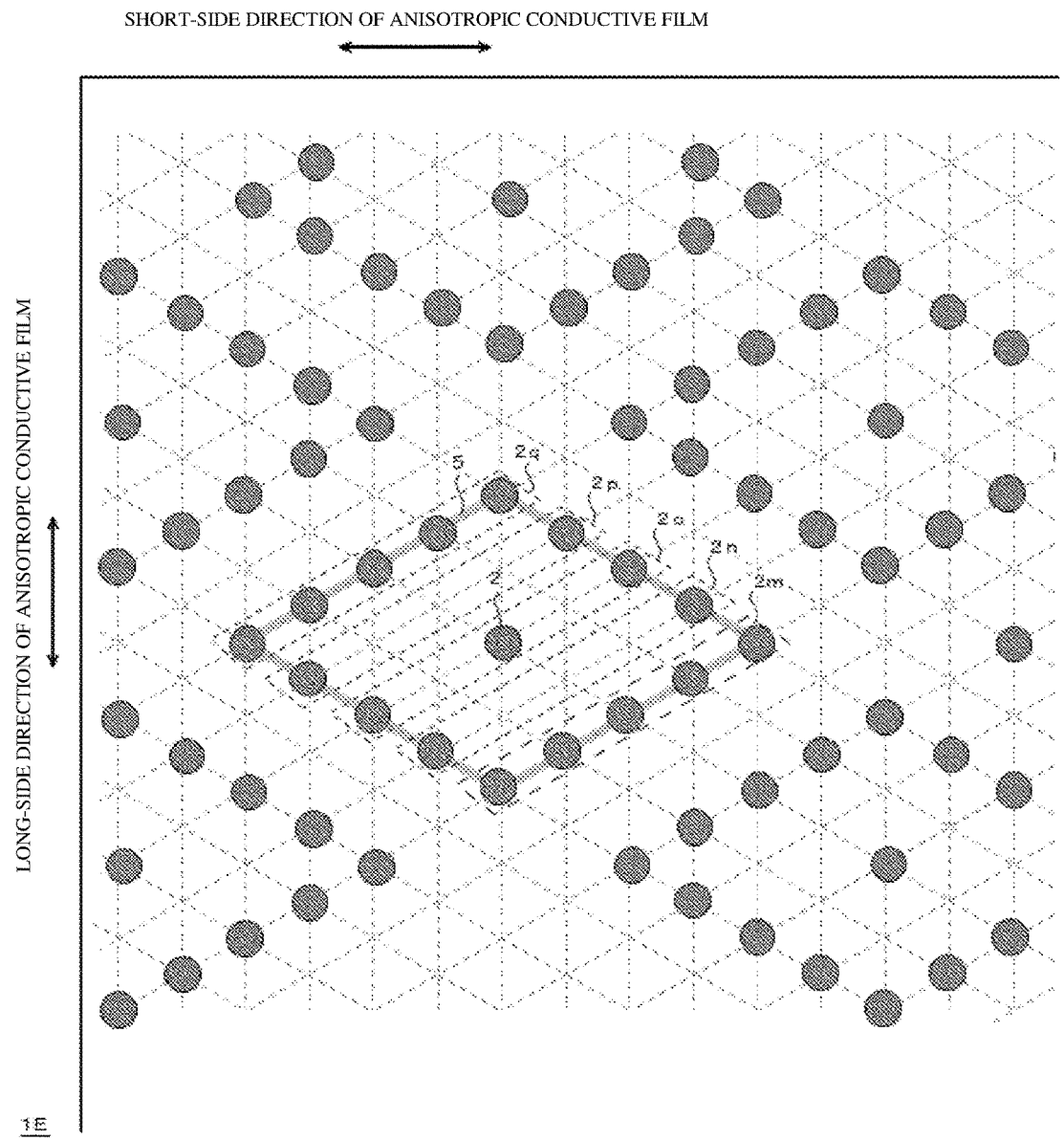

[FIG. 6]
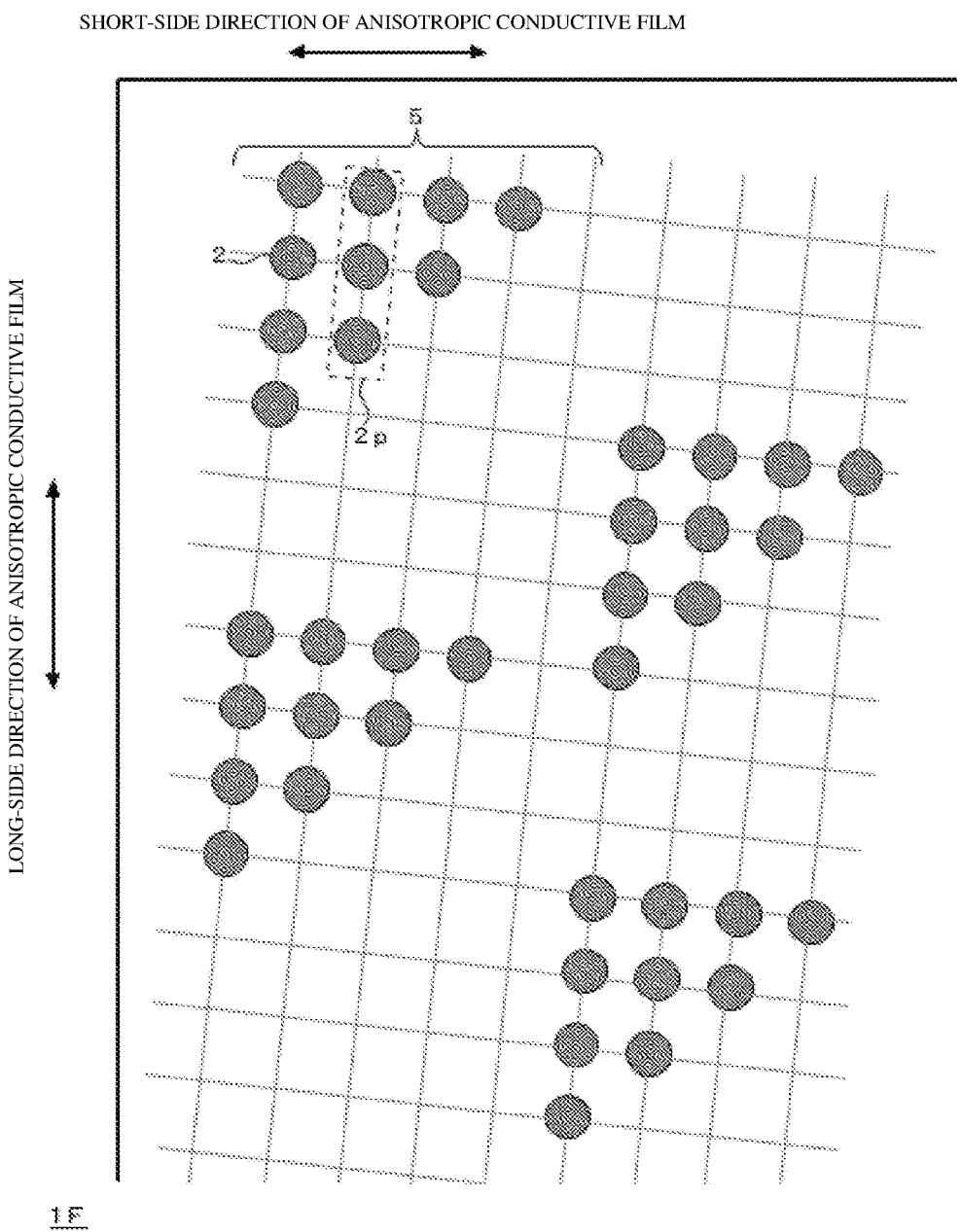

[FIG. 7]
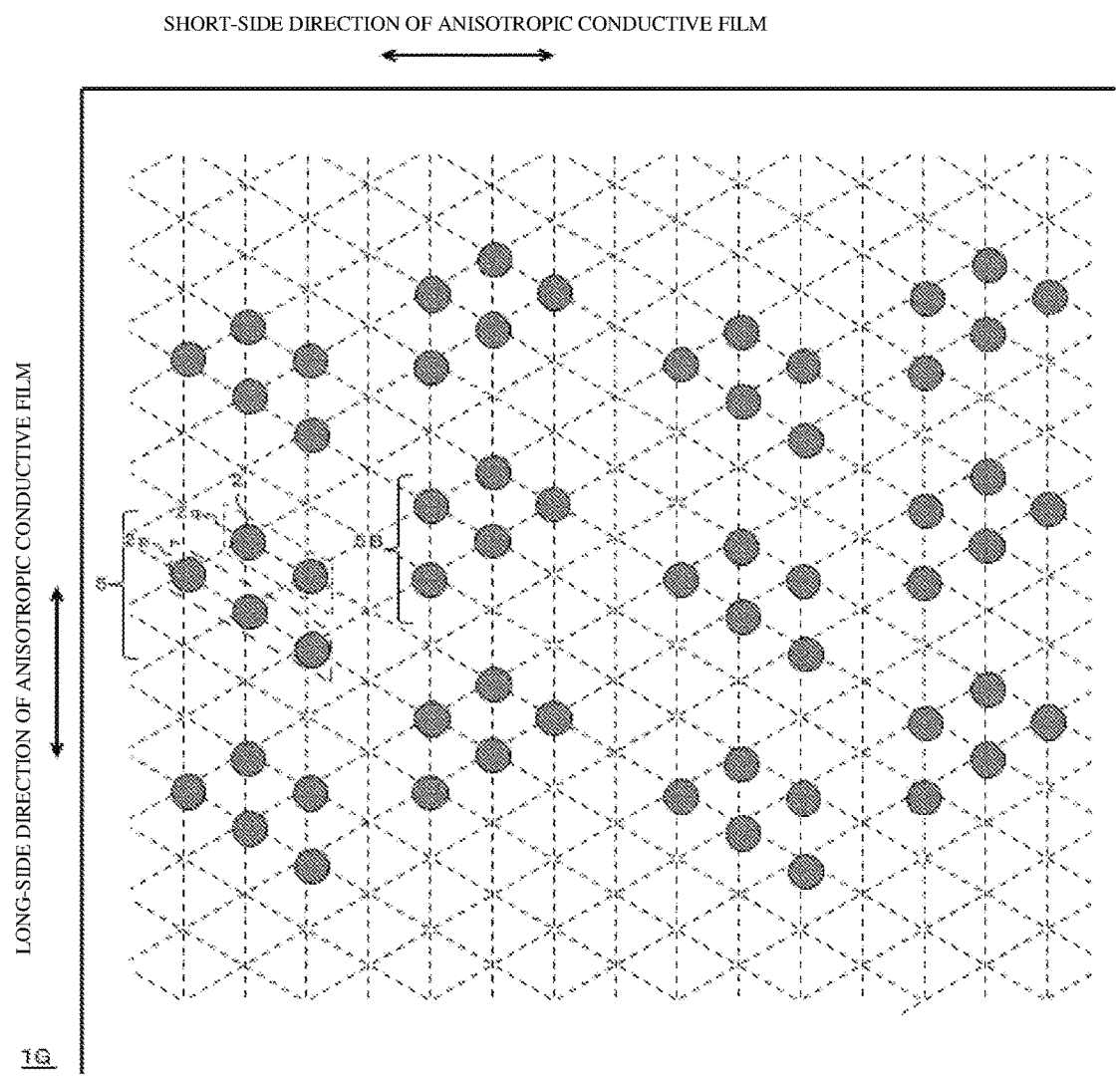

[FIG. 8]
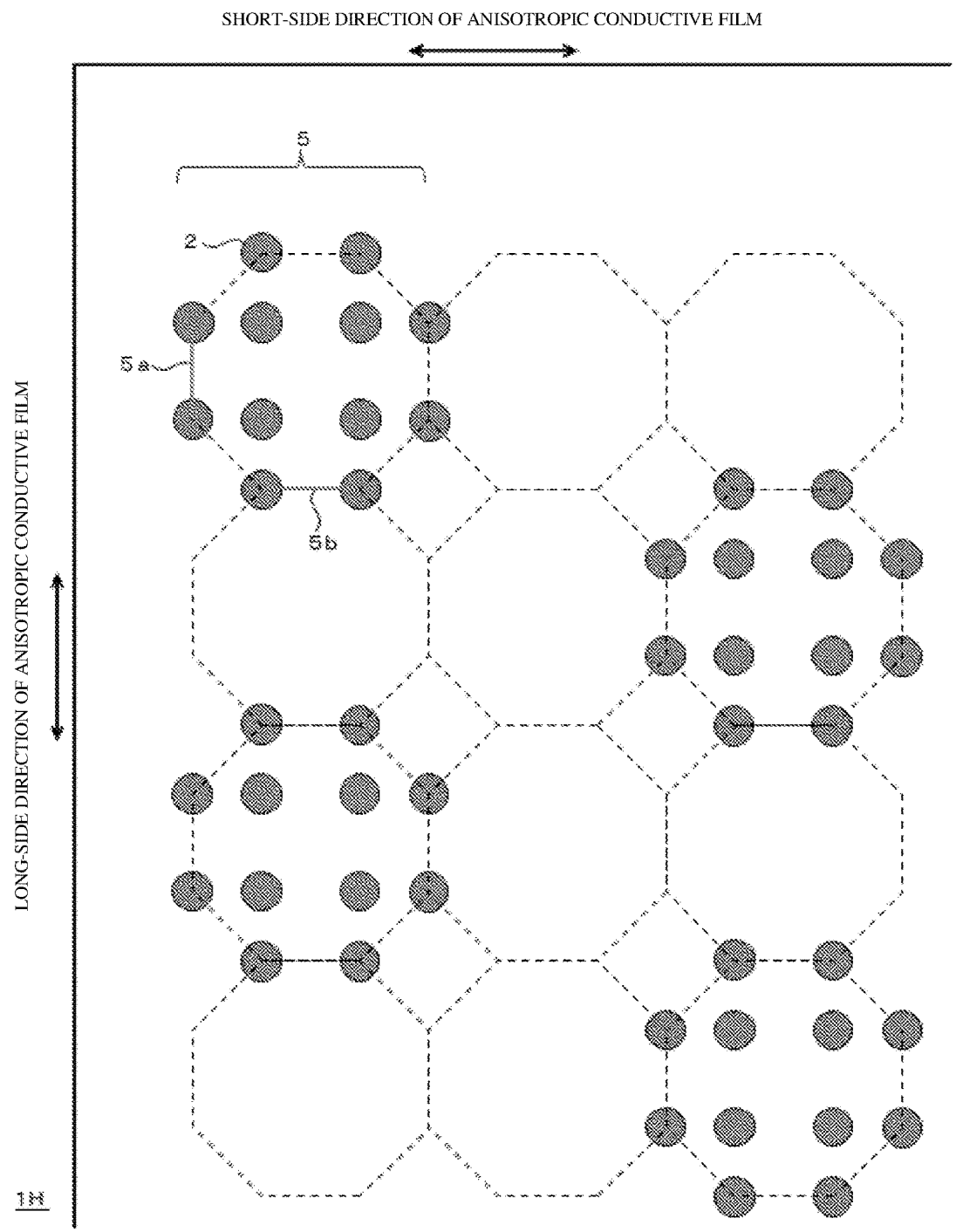

[FIG. 9]
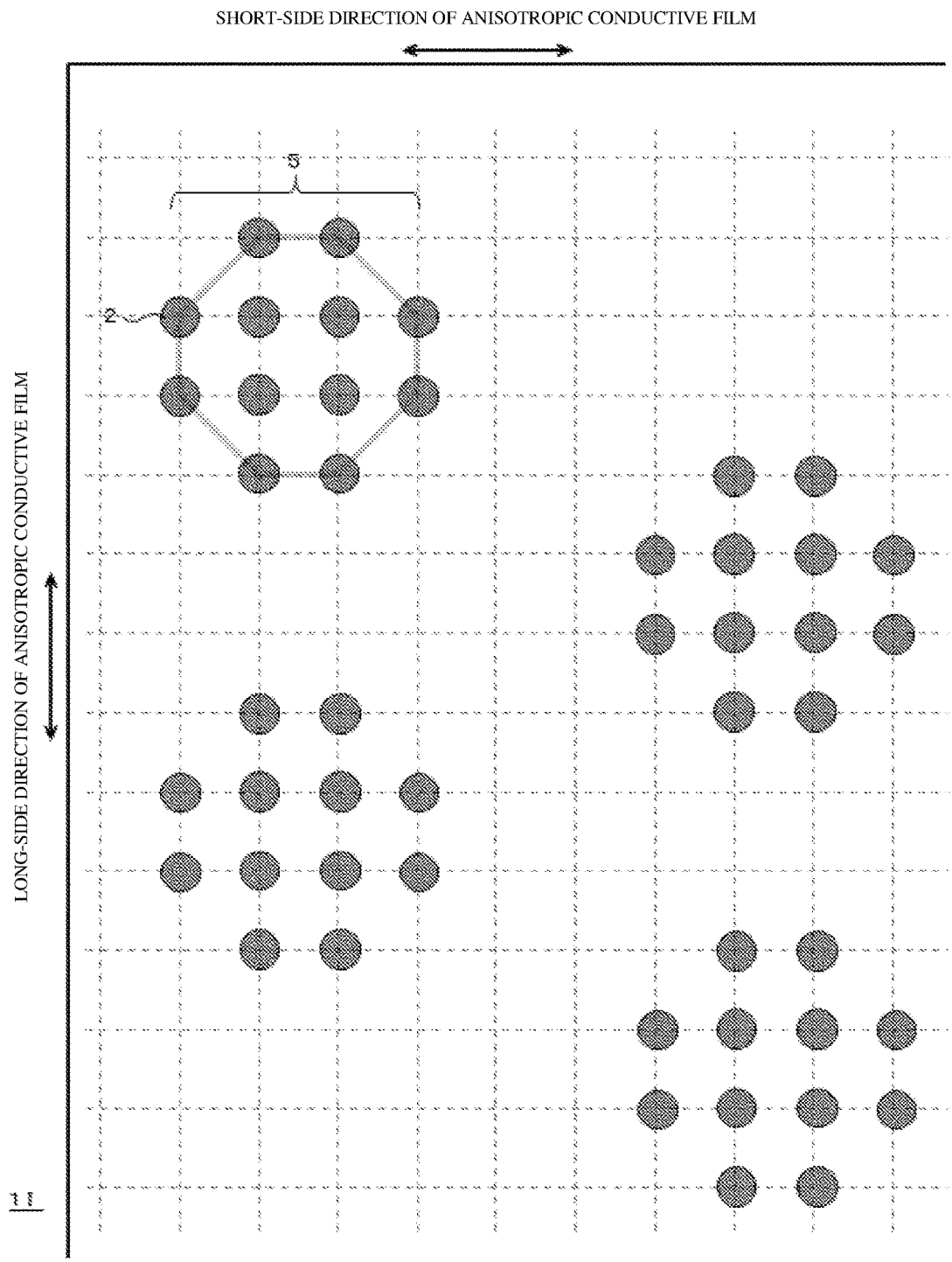

[FIG. 10]
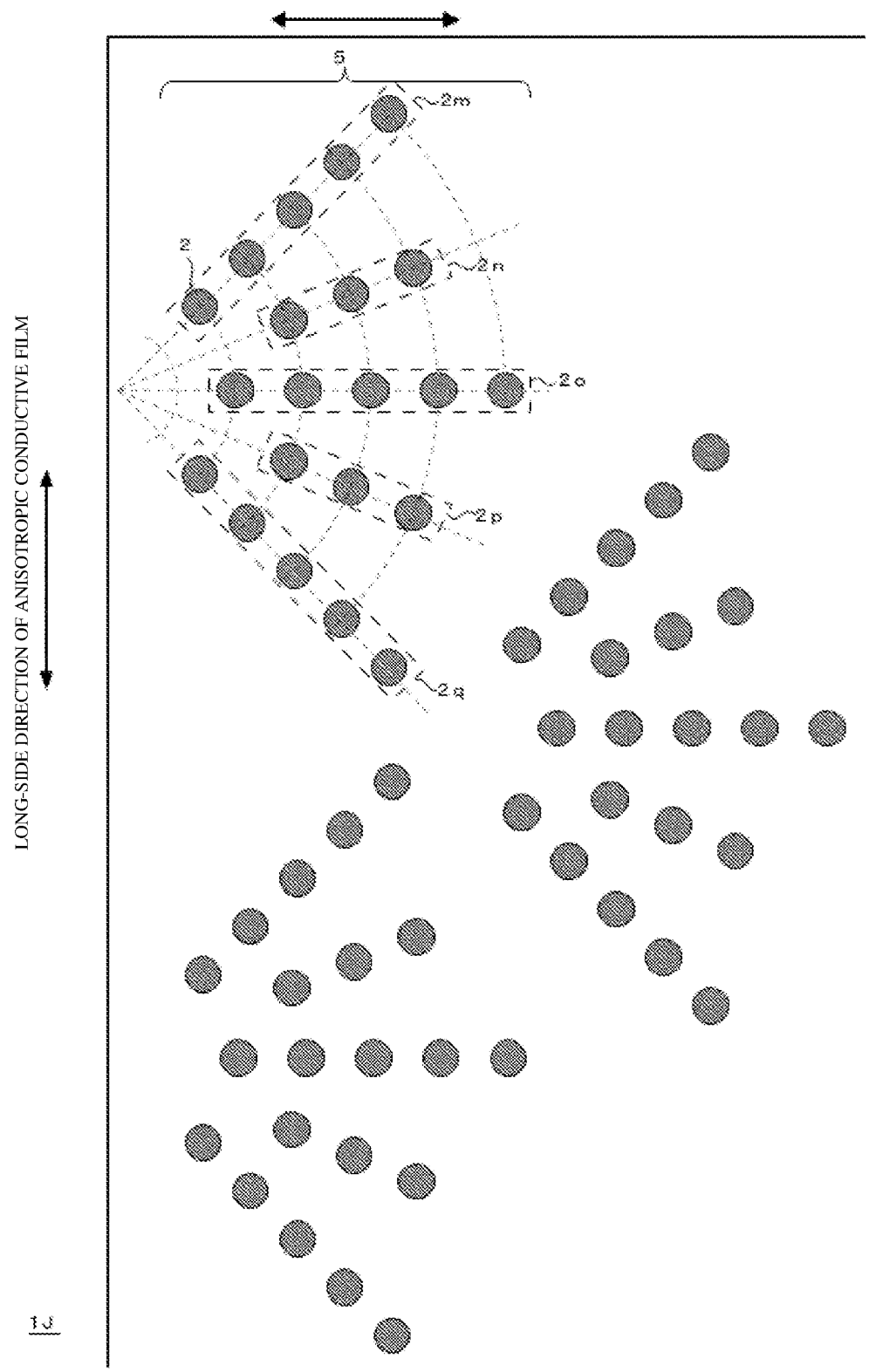

[FIG. 11]
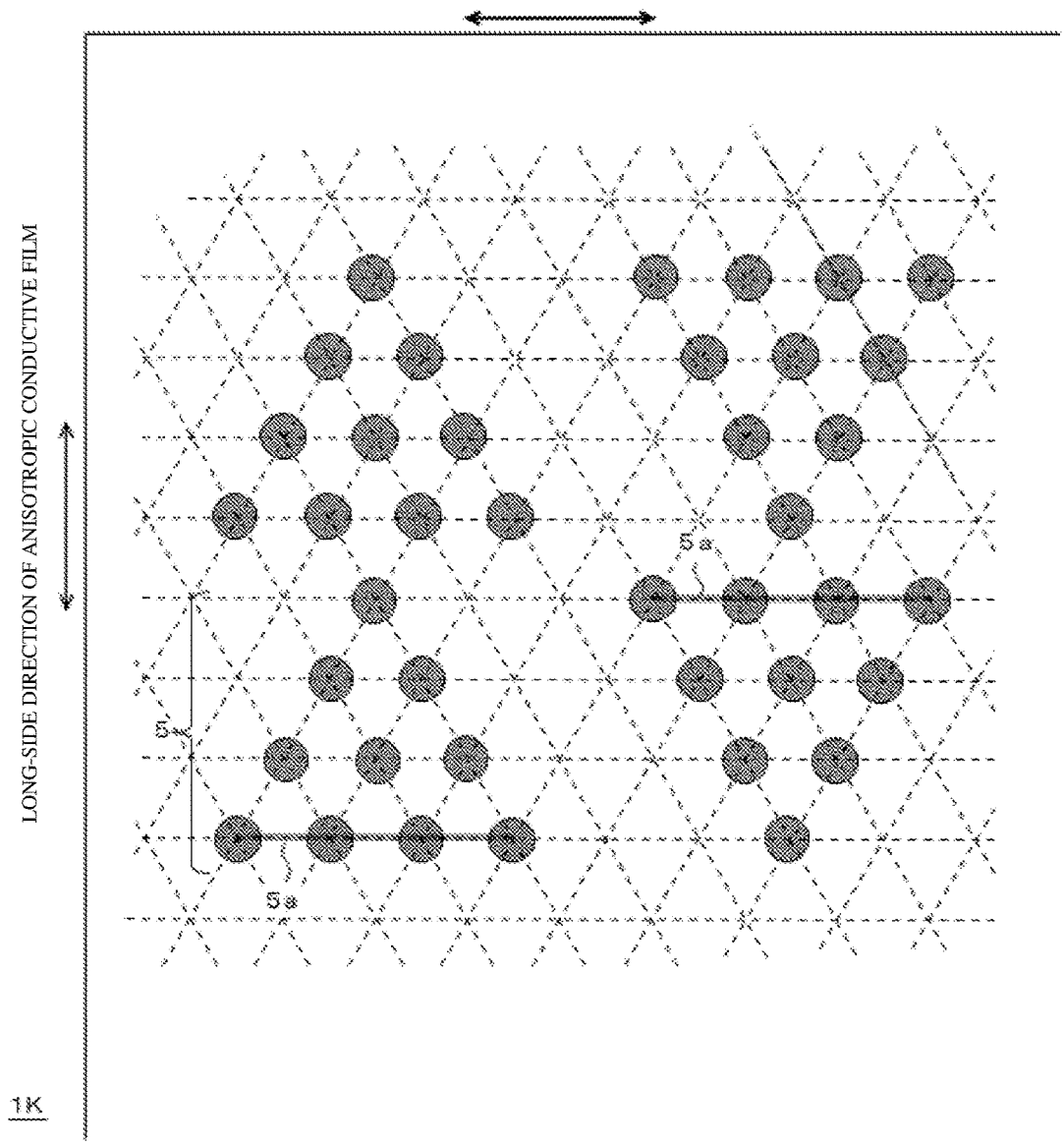

[FIG. 12]
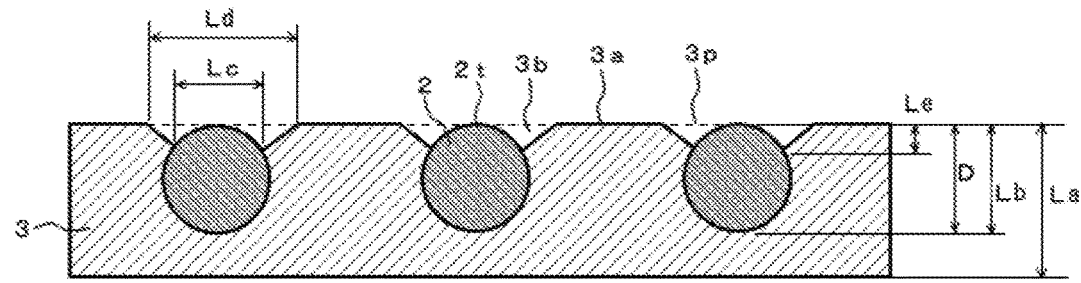
[FIG. 13]
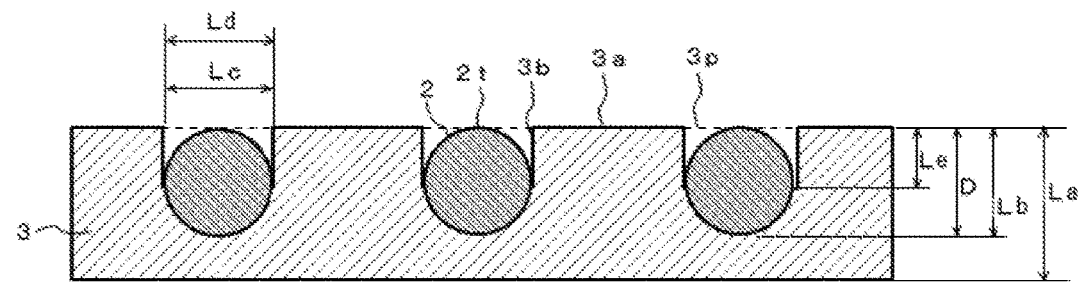
[FIG. 14]
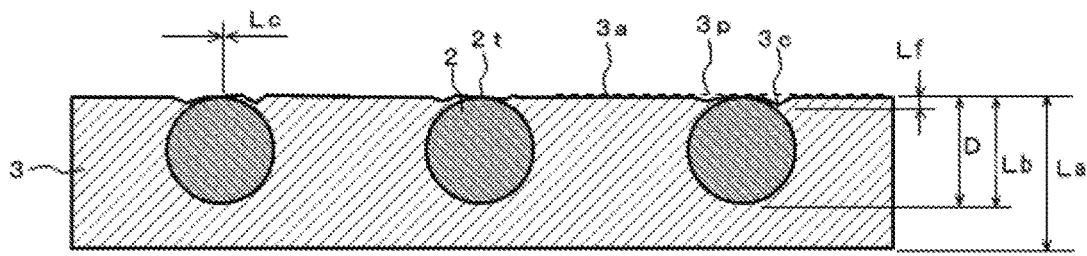

[FIG. 15]
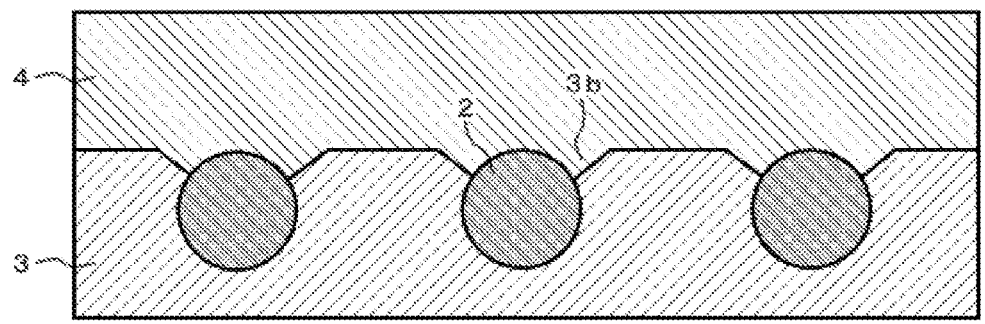
[FIG. 16]
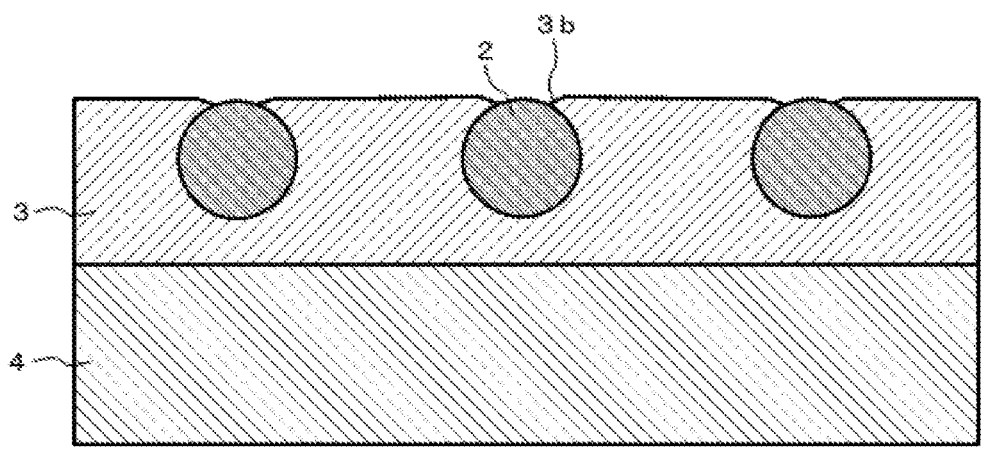

ANISOTROPIC CONDUCTIVE FILM

TECHNICAL FIELD

The present invention relates to an anisotropic conductive film.

BACKGROUND ART

Anisotropic conductive films in which conductive particles are dispersed in an insulating resin binder are widely used when mounting electronic components such as IC chips to wiring boards or the like. In an anisotropic conductive film, there is a strong demand to increase the capacity to capture conductive particles on bumps and to avoid shorting between adjacent bumps by narrowing the pitch of bumps, which accompany the high-density mounting of electronic components.

To meet such a demand, it has been proposed to use a lattice-like arrangement for the disposition of conductive particles in an anisotropic conductive film, to make the arrangement axis inclined with respect to the long-side direction of the anisotropic conductive film, and to increase the distance between conductive particles by a prescribed ratio in this case (Patent Documents 1 and 2). It has also been proposed to link conductive particles so as to form locally dense regions of conductive particles and to accommodate the narrowing of the pitch (Patent Document 3).

CITATION LIST

Patent Literature

Patent Document 1: JP 4887700 B
Patent Document 2: JPH09-320345 A
Patent Document 3: JP 2002-519473 T

SUMMARY OF INVENTION

Technical Problem

As described in Patent Documents 1 and 2, when conductive particles are arranged in a simple lattice form, the layout of the bumps is accommodated by the angle of inclination of the arrangement axis or the distance between conductive particles. Therefore, when the bumps have a narrow pitch, the distance between the conductive particles needs to be narrowed, which makes it difficult to avoid shorting. In addition, the number density of the conductive particles increases, and the production cost of the anisotropic conductive film also increases.

On the other hand, when the distance between conductive particles is not narrowed, there is a concern that a sufficient number of conductive particles may not be captured at the terminals.

In addition, in a technique of forming locally dense regions of conductive particles by linking conductive particles, the risk of shorting becomes high when a plurality of linked conductive particles simultaneously enter the same space between bumps, which is not preferable.

Therefore, an object of the present invention is to provide an anisotropic conductive film capable of accommodating bumps with a narrow pitch and capable of reducing the number density of conductive particles in comparison to known anisotropic conductive films.

Solution to Problem

The present inventors discovered that when conductive particle units forming a specific arrangement are repeatedly disposed over the entire surface of an anisotropic conductive film while leaving space between the respective conductive particles, sparse and dense regions of conductive particles can be formed over the entire surface of the film. Therefore, bumps with a narrow pitch can be connected in the dense region among the sparse and dense regions, and the conductive particles are separated from one another even in the dense region, and therefore the risk of shorting decreases, while the number density of the conductive particles of the entire film can be reduced by the existence of the sparse region. The present inventors thereby created the present invention.

That is, the present invention provides an anisotropic conductive film including conductive particles disposed in an insulating resin binder;

wherein the conductive particles are rows of conductive particles arranged in single rows with spacing therebetween; and repeating units of conductive particles formed by juxtaposition of the rows of different numbers of conductive particles are disposed repeatedly.

Advantageous Effects of Invention

With the anisotropic conductive film of the present invention, the individual conductive particles are not arranged in a simple lattice form, and repeating units of conductive particles having a specific particle arrangement are disposed repeatedly. Therefore, sparse and dense regions of conductive particles can be formed on the film, and thereby increases in the number density of conductive particles can be suppressed over the entire anisotropic conductive film. Accordingly, increases in production cost associated with increases in the number density of conductive particles can be suppressed. In addition, when the number density of conductive particles increases, the thrust required for the pressing jig at the time of anisotropic conductive connection typically also increases. However, with the anisotropic conductive film of the present invention, increases in the thrust required for the pressing jig at the time of anisotropic conductive connection is also suppressed by the suppression of increases in the number density of conductive particles. This can prevent the electronic components from deforming due to anisotropic conductive connection. Further, since an excessively large thrust is unnecessary for the pressing jig, the thrust of the pressing jig stabilizes, so the quality in terms of the conduction properties or the like of the anisotropically conductively connected electronic components stabilizes.

On the other hand, with the anisotropic conductive film of an embodiment of the present invention, repeating units serving as dense regions of conductive particles are formed repeatedly in the lengthwise and crosswise directions, so bumps of a narrow pitch can be connected. Further, since the conductive particles are separated from one another within the repeating units, the occurrence of shorting can be avoided even in a case where the repeating units straddle the space between terminals.

BRIEF DESCRIPTION OF DRAWINGS

FIG. 1A is a plan view illustrating the disposition of conductive particles in an anisotropic conductive film 1A of examples.

FIG. 1B is a cross-sectional view of the anisotropic conductive film 1A of the examples.

FIG. 2 is a plan view of an anisotropic conductive film 1B of the examples.

FIG. 3 is a plan view of an anisotropic conductive film 1C of the examples.

FIG. 4 is a plan view of an anisotropic conductive film 1D of the examples.

FIG. 5 is a plan view of an anisotropic conductive film 1E of the examples.

FIG. 6 is a plan view of an anisotropic conductive film 1F of the examples.

FIG. 7 is a plan view of an anisotropic conductive film 1G of the examples.

FIG. 8 is a plan view of an anisotropic conductive film 1H of the examples.

FIG. 9 is a plan view of an anisotropic conductive film 1I of the examples.

FIG. 10 is a plan view of an anisotropic conductive film 1J of the examples.

FIG. 11 is a plan view of an anisotropic conductive film 1K of the examples.

FIG. 12 is a cross-sectional view of an anisotropic conductive film 1a of the examples.

FIG. 13 is a cross-sectional view of an anisotropic conductive film 1b of the examples.

FIG. 14 is a cross-sectional view of an anisotropic conductive film 1c of the examples.

FIG. 15 is a cross-sectional view of an anisotropic conductive film 1d of the examples.

FIG. 16 is a cross-sectional view of an anisotropic conductive film 1e of the examples.

DESCRIPTION OF EMBODIMENTS

An anisotropic conductive film of an embodiment of the present invention will be described below in detail with reference to the drawings. Note that in the drawings, the same reference characters are used to indicate components that are the same or equivalent.

Overall Configuration of Anisotropic Conductive Film

FIG. 1A is a plan view illustrating the disposition of conductive particles in an anisotropic conductive film 1A of an example of the present invention, and FIG. 1B is a cross-sectional view thereof.

This anisotropic conductive film 1A has a structure in which conductive particles 2 are disposed in a single layer on the surface of an insulating resin binder 3 or in the vicinity thereof, and an insulating adhesive layer 4 is laminated thereon.

Note that the anisotropic conductive film of an embodiment of the present invention may also have a configuration in which the insulating adhesive layer 4 is omitted and the conductive particles 2 are embedded in the insulating resin binder 3.

Conductive Particles

Any conductive particles used in a known anisotropic conductive film may be appropriately selected and used as the conductive particles 2. Examples of the conductive particles include metal particles such as nickel, copper, silver, gold, and palladium and metal-coated resin particles, where the surface of resin particles such as polyamide and polybenzoguanamine is coated with a metal such as nickel. The size of the disposed conductive particles is preferably from 1 to 30 μm, more preferably not less than 1 μm and not greater than 10 μm, and even more preferably not less than 2 μm and not greater than 6 μm.

The average particle diameter of the conductive particles 2 can be measured by using an image-type or laser-type particle size distribution meter. The anisotropic conductive film may be observed in a plan view to measure and determine the particle diameter. In this case, preferably at least 200 particles, more preferably at least 500 particles, and even more preferably at least 1000 particles are measured.

The surfaces of the conductive particles 2 are preferably coated by insulating coating, insulating particle treatment, or the like. Such coating is to be easily peeled from the surfaces of the conductive particles 2 and is not to inhibit anisotropic conductive connection. In addition, protrusions may be formed on all or a portion of the surfaces of the conductive particles 2. The height of the protrusions is not greater than 20% and preferably not greater than 10% of the conductive particle diameter.

Disposition of Conductive Particles

Repeating Units

The disposition of the conductive particles 2 in the plan view of the anisotropic conductive film 1A is such that repeating units 5, in which rows of conductive particles $2p$, $2q$, and $2r$ and single conductive particles $2s$ are arranged, are repeated in the lengthwise and crosswise directions (X-direction and Y-direction) over the entire surface of the anisotropic conductive film 1A. The polygons formed by sequentially connecting the centers of the conductive particles forming the outer shapes of the repeating units 5 are triangles. Note that the anisotropic conductive film of an embodiment of the present invention may have regions in which no conductive particles are disposed as necessary.

The respective rows of conductive particles $2p$, $2q$, and $2r$ are arranged linearly in single rows of the conductive particles 2 with spacing therebetween in a plan view thereof. In addition, the numbers of conductive particles constituting the rows of conductive particles $2p$, $2q$, and $2r$ gradually differ from one another, and the rows of conductive particles $2p$, $2q$, and $2r$ are arranged parallel to one another. By repeating the particle disposition in which the rows of conductive particles $2p$, $2q$, and $2r$ with gradually differing numbers of particles are arranged, the number density of the conductive particles forms localized sparse and dense regions. Therefore, even in a case where there is minute displacement when the anisotropic conductive film is attached to an electronic component, a stable number of conductive particles are easily captured in any of the bumps constituting a row of bumps. This becomes more effective when anisotropically conductive connection is performed continuously. That is, when the attachment of an anisotropic conductive film with a simple lattice arrangement to an electronic component is shifted slightly, the number of captured particles easily fluctuates with the presence or absence or degree of displacement, particularly at the bump end portions. To suppress this fluctuation, it has been proposed to tilt the angle of the lattice arrangements with respect to the long-side direction of the film (Patent Document 1 or the like). However, when the bump width or the distance between bumps becomes narrow, limitations arise in the effect of tilting the lattice arrangement. In contrast, the present invention is configured so that, by sparse and dense regions of the number density of conductive particles over the range of the bump length, conductive particles may be captured in any of the locations over the range of the bump length. In other words, positions where conductive particles are captured and positions where conductive particles are not captured are generated simultaneously on a single bump. As a result, in any of the bump arrangements, as long as the bump shape (area) is the same, the number of conductive particles captured by the bumps is stabilized by appropriately determining the repetition spacing of the repeating units. Accordingly, the state of capturing conductive particles in the bump arrangements of each connection body is easily stabilized, even in a case where minute displacement occurs in the attachment of the anisotropic conductive film or when continuously producing connection bodies on a production line. In addition, a reduction in testing labor after anisotropically conductive connection or an improvement in quality control can be anticipated as a result of simultaneously generating positions where conductive particles are captured and positions where conductive particles are not captured with a single bump. For example, by simultaneously generating positions where conductive particles are captured and positions where conductive particles are not captured with a single bump, it becomes easy to compare connection bodies that are continuously obtained in indentation inspections after anisotropically conductive connection. In addition, the presence or absence of displacement after the temporary attachment of an anisotropic conductive film to an electronic component in the anisotropically conductive connection process can be compared between connection bodies that are produced continuously. Thus, it can be anticipated that improvements in the connection apparatus can be more easily assessed.

The disposition of conductive particles 2 in the repeating units 5 is a disposition in which a portion of the conductive particles 2 constituting the repeating units 5 covers a portion of the vertices of each regular hexagon when regular hexagons are arranged without spacing therebetween. Alternatively, when equilateral triangles are arranged without spacing therebetween, the disposition is such that the vertices of the equilateral triangles and the conductive particles constituting the repeating units 5 overlap. In other words, the disposition remaining after the conductive particles of prescribed lattice points are regularly removed from a disposition in which conductive particles are present at each lattice point of a hexagonal lattice arrangement forms the repeating units 5. When the conductive particles 2 are disposed at the lattice points of a hexagonal lattice arrangement in this way, the disposition of the particles of the repeating units 5 becomes easy to recognize, which facilitates design. Note that, as described below, the disposition of the conductive particles in the repeating units is not limited to a disposition based on a hexagonal lattice, and it may be based on a square lattice, or it may be based on a disposition in which regular polygons of 8 or more sides are arranged lengthwise and crosswise and the edges of adjacent regular polygons are overlapped with one another.

Repeating Form of Repeating Units

More specifically, the repetition of the repeating units 5 in the anisotropic conductive film 1A illustrated in FIG. 1A is such that the repeating units 5 are repeated in the X-direction with particle spacing within the repeating units 5. In addition, in the Y-direction, repeating units 5B, which are formed by inverting the repeating units 5 over the axis of symmetry in the Y-direction, and the repeating units 5 are repeated alternately. In this case, the position on an edge of the anisotropic conductive film in the long-side direction when a polygon formed by successively connecting the centers of the conductive particles forming the outer shapes of a repeating unit is projected in the short-side direction of the anisotropic conductive film preferably partially overlaps with the same position of a repeating unit adjacent to the aforementioned repeating unit. This is because, in general, the width direction of the terminal of an electronic component is the long-side direction of the anisotropic conductive film, so the probability of conductive particles being captured by the terminals of the electronic component increases when the polygons forming the outer shape of the repeating units overlap as described above. In addition, the long-side direction and the short-side direction of the anisotropic conductive film may be reversed. This is because, depending on the layout, it may be preferable to reverse the directions.

Note that when considering the repeating units of the conductive particles 2, units combining the repeating units 5 and repeating units 5B formed by inverting the repeating units 5 can also be considered repeating units of conductive particles, but in the present invention, a repeating unit is preferably the smallest unit formed by the juxtaposition of a plurality of rows of conductive particles which is repeated in the lengthwise and crosswise directions.

Size of Repeating Units

The size of the repeating units 5 or the distance between repeating units in the long-side direction of the anisotropic conductive film is preferably determined by the bump width of the electronic component to be connected by the anisotropic conductive film 1A or the size of the spaces between bumps.

For example, when the object of connection has a non-fine pitch, the size of the repeating units 5 in the long-side direction of the anisotropic conductive film is preferably smaller than the length of the smaller of the bump width and the space between bumps. By repeatedly disposing the repeating units 5 of this size, the minimum number of conductive particles required for connection can be captured on the bumps, and the number of conductive particles that do not participate in connection can be reduced, so the cost of the anisotropic conductive film can be reduced. In addition, by tilting the edges of the polygons forming the outer shape of the repeating units 5 in the short-side direction of the anisotropic conductive film 1A, stable connection performance can be achieved, regardless of the cutout position of a long anisotropic conductive film.

The distance between adjacent repeating units 5 and 5B in the long-side direction of an anisotropic conductive film when the object of connection has a non-fine pitch is preferably shorter than the spaces between the bumps of the electronic component to be connected by the anisotropic conductive film.

On the other hand, when the object of connection has a fine pitch, the size of the repeating units 5 and 5B in the long-side direction of the anisotropic conductive film is preferably a size that allows the units to straddle the spaces between bumps.

Note that the boundary between a fine pitch and a non-fine pitch may be such that, for example, a fine pitch is defined by a bump width of less than 30 μm and a non-fine pitch is defined by a bump width of 30 μm or greater.

When determining the size of the repeating units 5 in accordance with the object of connection as described above, the number of conductive particles constituting the repeating units 5 is preferably at least 5 particles, more preferably at least 10 particles, and even more preferably at least 20 particles. This is to ensure that, since it is typically preferable that at least 3 and, in particular, at least 10 conductive particles be captured between the opposing terminals connected by anisotropically conductive connection, it can be confirmed from the indentation of a single repeating unit that such a number of conductive particles are captured when the repeating units are sandwiched between opposing terminals.

Specific Variation of Repeating Units

In an embodiment of the present invention, the disposition of the conductive particles 2 in the repeating units 5 or the lengthwise and crosswise repetition pitch of the repeating units 5 may be varied appropriately in accordance with the shape or pitch of the terminals to be connected through anisotropically conductive connection. Accordingly, in comparison to a case in which the conductive particles 2 are arranged in a simple lattice form, high capturing performance can be achieved with a small number of conductive particles over the entire anisotropic conductive film.

For example, in addition to the mode of repetition illustrated in FIG. 1A, the repeating units 5 may be repeated in a staggered arrangement, as in the case of the anisotropic conductive film 1B illustrated in FIG. 2. In a staggered arrangement, the effect of resin flow on the conductive particles at the time of the anisotropic conductive connection of an electronic component differs between bumps positioned in the central portion of the staggered arrangement and bumps positioned on the outside, and the possibility of shorting also differs between bumps positioned in the central portion of the staggered arrangement and bumps positioned on the outside. Thus, the shape of the repeating units 5 can be modified appropriately to adjust the resin flow.

The disposition of the conductive particles 2 in the repeating units 5 may also be varied appropriately in accordance with the shape or pitch of the terminals to be connected through anisotropically conductive connection. For example, as in the case of the anisotropic conductive film 1C illustrated in FIG. 3, the number of conductive particles constituting the row of conductive particles 2p within a single repeating unit 5 may be gradually increased and decreased, and single conductive particles 2s may be disposed repeatedly together with the repetition of the repeating units 5. Further, in the three rows of conductive particles arranged within a single repeating unit, the number of conductive particles constituting the central row of conductive particles may be made larger or smaller than the numbers of conductive particles constituting the rows of conductive particles on both sides. For example, as in the case of the anisotropic conductive film 1D illustrated in FIG. 4, in each repeating unit 5, a row of four conductive particles 2p arranged, a row of two conductive particles 2q arranged similarly, a row of three conductive particles 2r arranged similarly, and a single conductive particle 2s are juxtaposed in the long-side direction of the anisotropic conductive film. By varying the numbers of conductive particles in the rows of conductive particles juxtaposed within a single repeating unit, the outer shape of the repeating unit becomes a complex polygonal shape. This makes it easier to accommodate the connection of radial bump arrangements (so-called fan-out bumps). The disposition of conductive particles in a single repeating unit is expressed by the number of conductive particles of the rows of conductive particles constituting the repeating unit. For example, when the repeating unit illustrated in FIG. 4 is expressed as [4-2-3-1], examples of variations of this repeating unit include [4-1-4-1], [4-3-1-2], [3-2-2-1], [4-1-2-3], and [4-2-1-3]. These may be combined to form a repeating disposition. One such example is [4-2-3-1-2-1-4-3].

In addition, the distances between the conductive particles within a single row of conductive particles may be the same or different for each of the rows of conductive particles juxtaposed within a single repeating unit. For example, as in the case of the anisotropic conductive film 1E illustrated in FIG. 5, the outer shape of the repeating unit 5 may be a diamond shape, and a conductive particle 2 may be disposed in the central portion thereof. In this repeating unit, a row of conductive particles 2m including five conductive particles, a row of conductive particles 2n including two conductive particles, a row of conductive particles 2o including three conductive particles, a row of conductive particles 2p including two conductive particles, and a row of conductive particles 2q including five conductive particles are juxtaposed. The distance between the conductive particles in the rows of conductive particles 2m and 2q, the distance between the conductive particles in the rows of conductive particles 2n and 2p, and the distance between the conductive particles in the row of conductive particles 2o differ from one another. When this is expressed with the aforementioned arrangement [4-3-2-1], the arrangement may be such that the center particle of the three conductive particles are removed. This is because the possibility of shorting can be further reduced.

In the anisotropic conductive films 1A, 1B, 1C, 1D, and 1E described above, the disposition of the conductive particles 2 in the repeating units 5 and 5B is present at the lattice points of a hexagonal lattice, but as long as the rows of conductive particles 2p are juxtaposed, the arrangement may also be based on a square lattice, as in the case of the anisotropic conductive film 1F illustrated in FIG. 6.

The anisotropic conductive film 1G illustrated in FIG. 7 is one in which repeating units 5 including two rows of conductive particles 2p and 2q and repeating units 5B, wherein the arrangement axis of the conductive particles of the repeating units 5 is rotated by 60°, are disposed repeatedly over the entire surface of the film. In this way, certain repeating units may be used in combination with other repeating units formed by rotating the first repeating units by a prescribed angle.

For the shape of the repeating units, the polygon formed by successively connecting the conductive particles constituting the outer shape thereof may be a regular polygon. As a result, it becomes easy to recognize the disposition of the conductive particles, which is preferable. In this case, each of the conductive particles forming the repeating unit is not necessarily present at a lattice point of a hexagonal lattice or a square lattice. For example, as in the case of the anisotropic conductive film 1H illustrated in FIG. 8, the outer shape of the repeating units 5 may be formed into a regular octagon. In this case, as illustrated by the dotted lines in the drawing, the conductive particles forming the outer shape of the repeating units are disposed at the vertices of regular octagons in a lattice formed by arranging the regular octagons lengthwise and crosswise and making the edges of adjacent regular octagons overlap with one another. Similarly, the conductive particles may be disposed at the vertices of a regular dodecagon or a regular polygon of a greater number of sides. Note that the conductive particles may be disposed at the lattice points of a hexagonal lattice or a square lattice to form repeating units in which the outer shape is a substantially regular polygon of 8 or more sides. For example, the repeating units 5 of the anisotropic conductive film 1I illustrated in FIG. 9 are formed from conductive particles 2 disposed on the lattice points of a square lattice, resulting in octagons which are symmetrical in both the long-side direction and the short-side direction of the anisotropic conductive film. As a result, the disposition of the conductive particles can be recognized easily.

In addition, the rows of conductive particles juxtaposed in the repeating units are not necessarily parallel to one another, and the rows may also be arranged radially. For example, as in the anisotropic conductive film 1J illustrated in FIG. 10, repeating units 5 including rows of conductive particles 2m, 2n, 2o, 2p, and 2q arranged radially may be disposed repeatedly in the lengthwise and crosswise directions. In this case, the conductive particles 2 are not necessarily present at the lattice points of a hexagonal lattice or a square lattice.

Orientation of Edges of Repeating Units

Of the anisotropic conductive films described above, in the anisotropic conductive film 1A illustrated in FIG. 1A, for example, each edge of the triangle 5x formed by successively connecting the centers of the conductive particles forming the outer shape of the repeating unit 5 intersects diagonally with the long-side direction or the short-side direction of the anisotropic conductive film 1A. As a result, a circumscribed line L1 of a conductive particle 2a in the long-side direction of the anisotropic conductive film passes through an conductive particle 2b adjacent to the conductive particle 2a in the long-side direction of the anisotropic conductive film. In addition, a circumscribed line L2 of the conductive particle 2a in the short-side direction of the anisotropic conductive film passes through a conductive particle 2c adjacent to the conductive particle 2a in the short-side direction of the anisotropic conductive film. Since the long-side direction of an anisotropic conductive film is typically the short-side direction of the bumps at the time of anisotropic conductive connection, when the edges of the polygons 5x of the repeating units 5 intersect diagonally with the long-side direction or the short-side direction of the anisotropic conductive film 1A, a plurality of conductive particles can be prevented from being arranged linearly along the edges of the bumps. This prevents a phenomenon in which a plurality of conductive particles arranged linearly are collectively separated from the terminals so that they no longer contribute to conduction, and thereby enhances the capacity to capture the conductive particles 2.

Note that when the long-side direction of an anisotropic conductive film is the short-side direction of the bumps at the time of anisotropic conductive connecting, all of the edges of the polygons 5x formed by the conductive particles constituting the outer shape of the repeating units 5 do not necessarily need to intersect diagonally with the long-side direction or the short-side direction of the anisotropic conductive film, but from the perspective of the capacity to capture conductive particles, preferably at least two edges and more preferably at least three edges intersect diagonally with the long-side direction or the short-side direction of the anisotropic conductive film.

On the other hand, when the arrangement pattern of the bumps is radial (so-called fan-out bumps), the polygons forming the repeating units preferably have edges in the long-side direction or the short-side direction of the anisotropic conductive film. That is, to ensure that the bumps to be connected are not displaced one another by the thermal expansion of the substrate on which the bumps are provided, the arrangement pattern of the bumps is sometimes radial (for example, JP 2007-19550 A, 2015-232660 A, or the like), but in this case, the angles formed by the long-side direction of each bump and the long-side direction of the anisotropic conductive film gradually change. Therefore, even in a case where the edges of the polygons of the repeating units 5 do not intersect diagonally with the long-side direction or the short-side direction of the anisotropic conductive film, the edges of the polygons of the repeating units 5 and 5B intersect diagonally with the edges in the long-side direction of each bump arranged radially. Accordingly, a phenomenon can be avoided in which many of the conductive particles that are on the edge of a bump are not captured on that bump at the time of anisotropic conductive connecting so that the capacity to capture conductive particles decreases. On the other hand, a radial arrangement pattern of bumps is ordinarily formed symmetrically. Accordingly, from the perspective of facilitating the confirmation of the quality of the connection state by the indentations after anisotropically conductive connection, the polygons forming the outer shape of the repeating units 5 preferably have edges in the long-side direction or the short-side direction of the anisotropic conductive film. Therefore, in a case where the repeating units are the same triangles as those of the anisotropic conductive film 1A illustrated in FIG. 1A, for example, one edge 5a of the triangles forming the outer shape of the repeating units 5 is preferably disposed parallel to the long-side direction or the short-side direction of the anisotropic conductive film, as in the anisotropic conductive film 1K illustrated in FIG. 11. In addition, as in the repeating units 5 of the anisotropic conductive film 1H illustrated in FIG. 8, the repeating units may be provided with an edge 5a parallel to the long-side direction of the anisotropic conductive film and an edge 5b parallel to the short-side direction of the anisotropic conductive film.

Note that the disposition of conductive particles in an embodiment of the present invention is not limited to the arrangements of the illustrated repeating units. For example, the illustrated arrangements may be inclined. In this case, arrangements inclined by 90°, that is, modes in which the long-side direction and the short-side direction of the film are switched, are also included. In addition, the spacing of the repeating units 5 and the spacing of the conductive particles within the repeating units may also be varied.

Distance Between Nearest Conductive Particles

The distance between the nearest conductive particles is preferably not less than 0.5 times the average conductive particle diameter, both between adjacent conductive particles within the repeating units 5 and between adjacent conductive particles between the repeating units 5. The distance between the repeating units 5 is preferably greater than the distance between adjacent conductive particles within the repeating units 5. When this distance is too small, shorting becomes more likely to occur due to contact between conductive particles. The upper limit of the distance between adjacent conductive particles is determined in accordance with the bump shape or the bump pitch. For example, when the bump width is 200 µm and the space between bumps is 200 µm and at least one conductive particle is present in either the bump width or the space between bumps, the distance between conductive particles is less than 400 µm. From the perspective of ensuring the capacity for capturing conductive particles, the distance is preferably less than 200 µm.

Number Density of Conductive Particles

From the perspective of suppressing the production cost of the anisotropic conductive film and ensuring that the thrust required for the pressing jig used at the time of anisotropic conductive connecting does not become excessively large, the number density of the conductive particles is preferably not greater than 50000 particles/mm$^2$, more preferably not greater than 35000 particles/mm$^2$, and even more preferably not greater than 30000 particles/mm$^2$ when the average particle diameter of the conductive particles is less than 10 µm. On the other hand, since poor conduction due to the insufficient capture of conductive particles by the terminals is a concern when the number density of the conductive particles is too small, the number density is preferably not less than 300 particles/mm$^2$, more preferably not less than 500 particles/mm$^2$, and even more preferably not less than 800 particles/mm$^2$.

In addition, when the average particle diameter of the conductive particles is not less than 10 µm, the number density is preferably not less than 15 particles/mm$^2$, more preferably not less than 50 particles/mm$^2$, and even more preferably not less than 160 particles/mm$^2$. This is because the area occupancy ratio of the conductive particles also increases as the conductive particle diameter becomes larger. For the same reason, the number density is preferably not greater than 1800 particles/mm$^2$, more preferably not greater than 1100 particles/mm$^2$, and even more preferably not greater than 800 particles/mm$^2$.

Note that the number density of the conductive particles may deviate locally (for example, 200 μm×200 μm) from the number densities described above.

Insulating Resin Binder

As the insulating resin binder 3, a thermo-polymerizable composition, a photopolymerizable composition, a polymerizable composition using both light and heat, or the like that is used as an insulating resin binder in a known anisotropic conductive film may be appropriately selected and used. Of these, examples of thermo-polymerizable compositions include thermal radical polymerizable resin compositions containing an acrylate compound and a thermal radical polymerization initiator, thermal cationic polymerizable resin compositions containing an epoxy compound and a thermal cationic polymerization initiator, and thermal anionic polymerizable resin compositions containing an epoxy compound and a thermal anionic polymerization initiator. Examples of photopolymerizable compositions include photoradical polymerizable resin compositions containing an acrylate compound and a photoradical polymerization initiator. A plurality of types of polymerizable compositions may be used in combination as long as no particular problems arise. An example of combined use is the combined use of a thermal cationic polymerizable composition and a thermal radial polymerizable composition.

Here, a plurality of types of photopolymerization initiators which react with light of different wavelengths may be included. As a result, different wavelengths may be used for the photocuring of a resin forming the insulating resin layer at the time of the production of the anisotropic conductive film and the photocuring of a resin for bonding electronic components to one another at the time of anisotropic conductive connection.

In a case where the insulating resin binder 3 is formed using a photopolymerizable composition, all or a portion of the photopolymerizable composition contained in the insulating resin binder 3 may be photocured by means of photocuring at the time of the production of the anisotropic conductive film. As a result of this photocuring, the disposition of the conductive particles 2 in the insulating resin binder 3 is maintained or stabilized, which yields prospects for the suppression of shorting and the enhancement of capturing. In addition, by adjusting the conditions of this photocuring, the viscosity of the insulating resin layer in the production process of the anisotropic conductive film can be adjusted.

The compounded amount of the photopolymerizable compound in the insulating resin binder 3 is preferably not greater than 30 mass %, more preferably not greater than 10 mass %, and even more preferably less than 2 mass %. This is because when the amount of the photopolymerizable compound is too large, the thrust required for pressing at the time of anisotropic conductive connection increases.

On the other hand, the thermo-polymerizable composition contains a thermo-polymerizable compound and a thermal polymerization initiator. As this thermo-polymerizable compound, a compound which also functions as a photopolymerizable compound may also be used. The thermo-polymerizable composition may also contain a photopolymerizable compound in addition to the thermo-polymerizable compound as well as a photopolymerization initiator. The composition preferably contains a photopolymerizable compound and a photopolymerizable initiator in addition to the thermo-polymerizable compound. For example, a thermal cationic polymerization initiator may be used as a thermal polymerization initiator, an epoxy resin may be used as a thermo-polymerizable compound, a photoradical polymerization initiator may be used as a photopolymerization initiator, and an acrylate compound may be used as a photopolymerizable compound. The insulating resin binder 3 may also contain a cured product of these polymerizable compositions.

The acrylate compound used as a thermo or photopolymerizable compound may be a known thermally polymerizable (meth)acrylate monomer. Examples thereof include monofunctional (meth)acrylate-based monomers and polyfunctional, that is, two or more functional, (meth)acrylate-based monomers.

In addition, an epoxy compound used as a polymerizable compound forms a three-dimensional mesh structure to provide good heat resistance and adhesiveness, and a solid epoxy resin and a liquid epoxy resin are preferably used in combination. Here, a solid epoxy resin refers to an epoxy resin which is a solid at room temperature. In addition, a liquid epoxy resin refers to an epoxy resin which is a liquid at room temperature. Room temperature refers to the temperature range from 5 to 35° C. prescribed by JIS Z 8703. In an embodiment of the present invention, two or more types of epoxy compounds may be used in combination. An oxetane compound may be used in addition to the epoxy compound.

The solid epoxy resin is not particularly limited as long as it is compatible with the liquid epoxy resin and is a solid at room temperature. Examples thereof include bisphenol A epoxy resins, bisphenol F epoxy resins, polyfunctional epoxy resins, dicyclopentadiene epoxy resins, novolac phenol epoxy resins, biphenol epoxy resins, and naphthalene epoxy resins. One type of these may be used alone, or two or more types may be used in combination. Of these, it is preferable to use a bisphenol A epoxy resin.

The liquid epoxy resin is not particularly limited as long as it is a liquid at room temperature, and examples include bisphenol A epoxy resins, bisphenol F epoxy resins, novolac phenol epoxy resins and naphthalene epoxy resins. One type of these may be used alone, or two or more types may be used in combination. In particular, it is preferable to use a bisphenol A epoxy resin from the perspective of tackiness of the film, flexibility, or the like.

Of the thermal polymerization initiator, examples of thermal radical polymerization initiators may include organic peroxides and azo compounds. In particular, organic peroxides may be preferred because they do not produce nitrogen, which can induce bubbles.

The amount of the thermal radical polymerization initiator to be used preferably ranges from 2 to 60 parts by mass, and more preferably from 5 to 40 parts by mass, per 100 parts by mass of a (meth)acrylate compound. When the amount is too small, insufficient curing will occur. When the amount is too large, the product life will decrease.

The thermal cationic polymerization initiator may be a known thermal cationic polymerization initiator for epoxy compounds. Examples of the initiator include iodonium salts, sulfonium salts, phosphonium salts, and ferrocenes, which generate acid via heat. In particular, aromatic sulfonium salts, which exhibit good temperature latency, may be preferred.

The amount of the thermal cationic polymerization initiator to be used preferably ranges from 2 to 60 parts by mass, and more preferably from 5 to 40 parts by mass, per 100 parts by mass of an epoxy compound. When the amount is too small, insufficient curing tends to occur. When the amount is too large, the product life tends to decrease.

A known agent that is ordinarily used can be used as the thermal anionic polymerization initiator. Examples include organic acid dihydrazide, dicyandiamide, amine compounds, polyamide amine compounds, cyanate ester compounds, phenol resins, acid anhydride, carboxylic acid, tertiary amine compounds, imidazole, Lewis acid, Bronsted acid salts, polymercaptan-based curing agents, urea resins, melamine resins, isocyanate compounds, and block isocyanate compounds. One type of these may be used alone, or two or more types may be used in combination. Of these, it is preferable to use a microcapsule-type latent curing agent formed by using an imidazole-modified substance as a core and covering the surface thereof with polyurethane.

The thermo-polymerizable composition preferably contains a film forming resin. The film-forming resin corresponds to a high-molecular-weight resin having an average molecular weight of not less than 10000, for example, and an average molecular weight of from approximately 10000 to approximately 80000 is preferable from the perspective of film formability. Examples of film-forming resins include various resins such as phenoxy resins, polyester resins, polyurethane resins, polyester urethane resins, acrylic resins, polyimide resins, and butyral resins. These may be used alone, or two or more types may be used in combination. Of these, a phenoxy resin is preferably used from the perspective of film formation state, connection reliability, and the like.

The thermo-polymerizable composition may also contain an insulating filler to adjust the melt viscosity. Examples of this include silica powders and alumina powders. The size of the insulating filler is preferably from 20 to 1000 nm, and the compounded amount is preferably from 5 to 50 parts by mass per 100 parts by mass of the thermo-polymerizable compound (photopolymerizable compound) such as an epoxy compound.

Further, the thermo-polymerizable composition may also contain fillers, softeners, promoters, antioxidants, colorants (pigments and dyes), organic solvents, ion scavengers, and the like which differ from the insulating filler described above.

In addition, stress relaxation agents, silane coupling agents, inorganic fillers, or the like may also be compounded as necessary. Examples of stress relaxation agents include hydrogenated styrene-butadiene block copolymers and hydrogenated styrene-isoprene block copolymers. Examples of silane coupling agents include epoxy-based, methacryloxy-based, amino-based, vinyl-based, mercapto-sulfoxide-based, and ureide-based silane coupling agents. Examples of inorganic fillers include silica, talc, titanium oxide, calcium carbonate, and magnesium oxide.

Note that the insulating resin binder 3 may be formed by depositing a coating composition containing the resin described above to form a layer with a coating method and drying or further curing, or otherwise by forming a film using a known technique in advance. The insulating resin binder 3 may be obtained by laminating a resin layer as necessary. In addition, the insulating resin binder 3 is preferably formed on a release film such as a polyethylene terephthalate film that has been release-treated.

Viscosity of Insulating Resin Binder

The minimum melt viscosity of the insulating resin binder 3 can be determined appropriately in accordance with the production method or the like of the anisotropic conductive film. For example, when a method of holding the conductive particles at a prescribed disposition on the surface of the insulating resin binder and pressing the conductive particles into the insulating resin binder is performed as the production method of the anisotropic conductive film, the minimum melt viscosity of the resin is preferably not less than 1100 Pa·s from the perspective of ensuring that the insulating resin binder enables film formation. In addition, as described below, from the perspective of forming concavities $3b$ around the exposed portions of the conductive particles 2 pressed into the insulating resin binder 3, as illustrated in FIG. 12 or 13, or from the perspective of forming concavities $3c$ directly above the conductive particles 2 pressed into the insulating resin binder 3, as illustrated in FIG. 14, the minimum melt viscosity is preferably not less than 1500 Pa·s, more preferably not less than 2000 Pa·s, even more preferably not less than 3000 to 15000 Pa·s, and particularly preferably from 3000 to 10000 Pa·s. The minimum melt viscosity may be determined in the following manner, for example. A rotary rheometer (available from TA Instruments) is used, a rate of temperature increase of 10° C./min and a measurement pressure of 5 g are maintained to be constant, and a measurement plate of 8 mm in diameter is used. In addition, in a case where a process of pressing the conductive particles 2 into the insulating resin binder 3 preferably at 40 to 80° C. and more preferably from 50 to 60° C. is performed, the lower limit of the viscosity at 60° C. is preferably not less than 3000 Pa·s, more preferably not less than 4000 Pa·s, and even more preferably not less than 4500 Pa·s, and the upper limit is preferably not greater than 20000 Pa·s, more preferably not greater than 15000 Pa·s, and even more preferably not greater than 10000 from the perspective of the formation of the concavities $3b$ or $3c$ as described above.

By setting the viscosity of the resin forming the insulating resin binder 3 to a high viscosity as described above, the conductive particles 2 inside the anisotropic conductive film can be prevented from being carried away by the flow of the melted insulating resin binder 3 in a case where the conductive particles 2 are sandwiched between objects to be connected such as opposing electronic components and pressurized while heating at the time of the use of the anisotropic conductive film.

Thickness of Insulating Resin Binder

The thickness La of the insulating resin binder 3 is preferably not less than 1 μm and not greater than 60 μm, more preferably not less than 1 μm and not greater than 30 μm, and even more preferably not less than 2 μm and not greater than 15 μm. In addition, the thickness La of the insulating resin binder 3 is preferably such that the ratio (La/D) is from 0.6 to 10 in the relationship between the thickness La and the average particle diameter D of the conductive particles 2. When the thickness La of the insulating resin binder 3 is too large, the conductive particles tend to be displaced at the time of anisotropic conductive connection, and the capacity to capture conductive particles at the terminals is diminished. This trend is marked when La/D exceeds 10. Therefore, La/D is more preferably not greater than 8 and even more preferably not greater than 6. Conversely, when the thickness La of the insulating resin binder 3 is too small and La/D is less than 0.6, it becomes difficult to keep the conductive particles in a prescribed particle dispersion state or a prescribed arrangement with the insulating resin binder 3. In particular, in a case where the terminal to be connected is a high-density COG, the ratio (La/D) of the layer thickness La of the insulating resin binder 3 to the particle diameter D of the conductive particles 2 is preferably from 0.8 to 2.

Mode in which Conductive Particles are Embedded in the Insulating Resin Binder

The embedded state of conductive particles 2 in the insulating resin binder 3 is not particularly limited. When anisotropically conductive connection is performed by sandwiching the anisotropic conductive film between opposing parts and applying pressure while heating, the conductive particles 2 are partially exposed from the insulating resin binder 3 to form concavities 3b around the exposed portions of the conductive particles 2 with respect to the tangential plane 3P of the surface 3a of the insulating resin binder in the central portion between adjacent conductive particles 2, as illustrated in FIGS. 12 and 13, or concavities 3c are formed in the insulating resin binder portion directly above the conductive particles 2 pressed into the insulating resin binder 3 with respect to the same tangential plane 3P as that described above, and waves are preferably present in the surface of the insulating resin binder 3 directly above the conductive particles 2, as illustrated in FIG. 14. With respect to the flattening of the conductive particles 2 which occurs when the conductive particles 2 are sandwiched between the electrodes of opposing electronic components and are pressurized while heating, the presence of the concavities 3b illustrated in FIGS. 12 and 13 leads to a reduction in the resistance applied to the conductive particles 2 from the insulating resin binder 3 in comparison to cases in which no concavities 3b are present. Therefore, the conductive particles 2 are more easily sandwiched between the opposing electrodes, and the conduction performance also improves. In addition, of the resins constituting the insulating resin binder 3, when concavities 3c (FIG. 14) are formed in the surface of the resin directly above the conductive particles 2, the pressure at the time of pressurization under heat is more easily concentrated on the conductive particles 2 than when no concavities 3c are present, and the conductive particles 2 are more easily held between the electrodes, which enhances the conduction performance.

From the perspective of more easily achieving the effect of the concavities 3b and 3c described above, the ratio (Le/D) of the maximum depth Le of the concavities 3b (FIGS. 12 and 13) around the exposed portions of the conductive particles 2 to the average particle diameter D of the conductive particles 2 is preferably less than 50%, more preferably less than 30%, and even more preferably from 20 to 25%. The ratio (Ld/D) of the maximum diameter Ld of the concavities 3b (FIGS. 12 and 13) around the exposed portions of the conductive particles 2 to the average particle diameter D of the conductive particles 2 is preferably not less than 100% and more preferably from 100 to 150%. The ratio (Lf/D) of the maximum depth Lf of the concavities 3c (FIG. 14) in the resin directly above the conductive particles 2 to the average particle diameter D of the conductive particles 2 is preferably greater than 0, more preferably less than 10%, and even more preferably less than 5%.

Note that the diameter Lc of the exposed portions of the conductive particles 2 is preferably not greater than the average particle diameter D of the conductive particles 2 and is preferably from 10 to 90% of the average particle diameter D. The conductive particles 2 may be exposed at one point at the apical part 2t of the particle, or the conductive particles 2 may be completely embedded in the insulating resin binder 3 so that the diameter Lc is zero.

Positions of Conductive Particles in Thickness Direction of Insulating Resin Binder From the perspective of more easily achieving the effect of the concavities 3b described above, the ratio (Lb/D) (called the "embedding percentage" hereafter) of the distance of the deepest part of the conductive particles 2 from the tangential plane 3p of the surface 3a of the insulating resin binder in the central portion between adjacent conductive particles 2 (called the "embedded amount" hereafter) to the average particle diameter D of the conductive particles 2 is preferably not less than 60% and not greater than 105%.

Insulating Adhesive Layer

In the anisotropic conductive film of an embodiment of the present invention, an insulating adhesive layer 4 having a different viscosity or tacky adhesiveness than the resins forming the insulating resin binder 3 may b e laminated on the insulating resin binder 3 in which the conductive particles 2 are disposed.

In a case where the concavities 3b described above are formed in the insulating resin binder 3, the insulating adhesive layer 4 may be laminated on the surface where the concavities 3b are formed in the insulating resin binder 3, as in the anisotropic conductive film 1d illustrated in FIG. 15, or may be laminated on the surface on the opposite side as the surface where the concavities 3b are formed, as in the anisotropic conductive film 1e illustrated in FIG. 16. This is also the same for cases in which the concavities 3c are formed in the insulating resin binder 3. As a result of the lamination of the insulating adhesive layer 4, the spaces formed by the electrodes or bumps of the electronic component can be filled when the electronic component is anisotropically conductively connected using the anisotropic conductive film, which makes it possible to enhance the adhesiveness.

In addition, when the insulating adhesive layer 4 is laminated on the insulating resin binder 3, the insulating adhesive layer 4 is preferably on the side of a first electronic component such as an IC chip (in other words, the insulating resin binder 3 is on the side of a second electronic component such as a substrate), regardless of whether the insulating adhesive layer 4 is located on the surface where the concavities 3b and 3c are formed or not. As a result, the unintended movement of the conductive particles can be avoided, and the capturing capacity can be enhanced. Note that the first electronic component and the second electronic component are subjected to main compression bonding after the anisotropic conductive film is temporarily compression-bonded with the second electronic component while the first electronic component such as an IC chip is on the pressing jig side and the second electronic component such as a substrate is on the stage side, but depending on the size of the like of the thermocompression bonding region of the second electronic component, the first electronic component and the second electronic component may be subjected to main compression bonding after the anisotropic conductive film is temporarily compression-bonded with the first electronic component.

As the insulating adhesive layer 4, a layer used as an insulating adhesive layer in a known anisotropic conductive film can be selected and used as appropriate. The viscosity of the insulating adhesive layer 4 may be adjusted to a lower level using the same resin as that of the insulating resin binder 3 described above. A greater difference between the minimum melt viscosities of the insulating adhesive layer 4 and the insulating resin binder 3 makes it easier for the space formed by the electrodes or bumps of the electronic component to be filled with the insulating adhesive layer 4, which makes it possible to anticipate an effect of enhancing the adhesiveness between electronic components. In addition, when this difference is greater, the amount of movement of the resin forming the insulating resin binder 3 becomes relatively small at the time of anisotropic conductive connection, and thereby the capacity to capture conductive particles at the terminals is more easily enhanced. From a practical standpoint, the minimum melt viscosity ratio of the insulating adhesive layer 4 and the insulating resin binder 3 is preferably not less than 2, more preferably not less than 5, and even more preferably not less than 8. On the other hand, when this ratio is too large, the protrusion or blocking of the resin may occur when a long anisotropic conductive film is formed into a wound body, and therefore the ratio is preferably not greater than 15 from a practical standpoint. More specifically, the preferable minimum melt viscosity of the insulating adhesive layer 4 satisfies the ratio described above and is not greater than 3000 Pa·s, more preferably not greater than 2000 Pa·s, and particularly preferably from 100 to 2000 Pa·s.

As a method of forming the insulating adhesive layer 4, the layer may be formed by depositing a coating composition containing the same resin as the resin used to form the insulating resin binder 3 with a coating method and drying or further curing, or by forming a film with a known technique in advance.

The thickness of the insulating adhesive layer 4 is preferably not less than 1 µm and not greater than 30 µm, and more preferably not less than 2 µm and not greater than 15 µm.

In addition, the minimum melt viscosity of the entire anisotropic conductive film combining the insulating resin binder 3 and the insulating adhesive layer 4 depends also on the ratio of the thickness of the insulating resin binder 3 to the thickness of the insulating adhesive layer 4. The minimum melt viscosity may be not greater than 8000 Pa·s from a practical standpoint, and to facilitate the filling of the spaces between bumps, the minimum melt viscosity may be from 200 to 7000 Pa·s and is preferably from 200 to 4000 Pa·s.

Furthermore, an insulating filler such as silica fine particles, alumina, and aluminum hydroxide may be added to the insulating resin binder 3 or the insulating adhesive layer 4 as necessary. The compounded amount of the insulating filler is preferably not less than 3 parts by mass and not greater than 40 parts by mass per 100 parts by mass of resin constituting the layers. Thereby, even when the anisotropic conductive film is melted during anisotropic conductive connection, it is possible to prevent the conductive particles from moving unnecessarily due to the melted resin.

Method for Producing Anisotropic Conductive Film

An example of a method for producing an anisotropic conductive film is a method of producing a transfer mold for disposing conductive particles in a prescribed arrangement, filling the concave portions of the transfer mold with conductive particles, covering the transfer mold with an insulating resin binder 3 formed on a release film and applying pressure, and pressing the conductive particles 2 into the insulating resin binder 3 to transfer the conductive particles 2 to the insulating resin binder 3. Alternatively, an insulating adhesive layer 4 may be further laminated on the conductive particles 2. Thus, the anisotropic conductive film 1A can be obtained.

In addition, an anisotropic conductive film may be produced by filling the concave portions of a transfer mold with conductive particles, covering the transfer mold with an insulating resin binder, transferring the conductive particles to the surface of the insulating resin binder from the transfer mold, and pressing the conductive particles on the insulating resin binder into the insulating resin binder. The amount of conductive particles that are embedded (Lb) can be adjusted by the pressing force, the temperature, or the like at the time of pressing. In addition, the shape and depth of the concavities 3b and 3c can be adjusted by the viscosity of the insulating resin binder, the pressing rate, the temperature, and the like at the time of pressing. For example, the lower limit of the viscosity of the insulating resin binder at the time of the pressing of the conductive particles is preferably not less than 3000 Pa·s, more preferably not less than 4000 Pa·s, and even more preferably not less than 4500 Pa·s, and the upper limit is preferably not greater than 20000 Pa·s, more preferably not greater than 15000 Pa·s, and even more preferably not greater than 10000 Pa·s. In addition, such a viscosity is achieved at a temperature of preferably from 40 to 80° C. and more preferably from 50 to 60° C. More specifically, when producing the anisotropic conductive film 1a having the concavities 3b illustrated in FIG. 12 on the surface of the insulating resin binder, the viscosity of the insulating resin binder at the time of the pressing of the conductive particles can be set to 8000 Pa·s (50 to 60° C.), and when producing the anisotropic conductive film 1c having the concavities 3c illustrated in FIG. 14, the viscosity of the insulating resin binder at the time of the pressing of the conductive particles can be set to 4500 Pa·s (50 to 60° C.).

Note that the transfer mold that is used may be, in addition to a mold in which the concave portions are filled with conductive particles, a mold in which a slightly adhesive agent is applied to the upper surfaces of convex portions so that the conductive particles adhere to the upper surfaces.

These transfer molds may be produced by using and applying a known technique such as machining, photolithography or printing.

In addition, the method used to dispose the conductive particles in a prescribed arrangement may be a method using a biaxially stretched film instead of a method using a transfer mold.

Wound Body

The anisotropic conductive film is preferably formed into a film wound body which is wound around a reel so as to be continuously provided for the connection of electronic components. The length of the film wound body may be not less than 5 m and is preferably not less than 10 m. The upper limit is not particularly limited, but from the perspective of the handleability of the shipped product, the length is preferably not greater than 5000 m, more preferably not greater than 1000 m, and even more preferably not greater than 500 m.

The film wound body may also be one in which an anisotropic conductive films which are shorter than the total length linked with connection tape. There may be a plurality of junctions, and the junctions may be distributed regularly or at random. Since the thickness of the connection tape is not particularly limited as long as the tape does not inhibit performance, but when the tape is too thick, the tape may affect the protrusion or blocking of the resin, the thickness is preferably from 10 to 40 µm. In addition, the film width is not particularly limited but is, for example, from 0.5 to 5 mm.

With a film wound body, a continuous anisotropically conductive connection can be achieved, which can contribute to a reduction in the cost of the connection body.

Connection Structure

The anisotropic conductive film of an embodiment of the present invention can be advantageously employed when anisotropically conductively connecting, by heat or light, a first electronic component, such as an FPC, an IC chip, or an IC module, to a second electronic component, such as an FPC, a rigid substrate, a ceramic substrate, a glass substrate, or a plastic substrate. Additionally, first electronic components can be anisotropically conductively connected by stacking IC chips or IC modules. Connection structures formed in this way and the production methods thereof are included within the scope of the present invention.

One method for connecting electronic components together using the anisotropic conductive film may be as follows, for example. One interface of the anisotropic conductive film is temporarily bonded to a second electronic component such as a wiring board mounted on a stage. The one interface is the interface where the conductive particles are present in the vicinity in the film thickness direction. A first electronic component, such as an IC chip, is mounted on the temporarily bonded anisotropic conductive film, and thermocompression bonding is performed from the first electronic component side using a pressing jig. This method is preferable from the standpoint of increasing the connection reliability. The connection of the same electronic components may also be achieved using photocuring.

Note that when it is difficult to temporarily bond the anisotropic conductive film to a second electronic component such as a wiring board due to the size or the like of the connection region of the second electronic component such as a wiring board, the temporary bonding of the anisotropic conductive film is performed with respect to a first electronic component such as an IC chip mounted on a stage, and the first and second electronic components are then subjected to thermocompression bonding.

EXAMPLES

Experimental Examples 1 to 8

Production of Anisotropic Conductive Film

For the anisotropic conductive films to be used in COG connection, the effects of the resin composition of the insulating resin binder and the disposition of the conductive particles on the film forming capacity and conduction properties were investigated as follows.

First, resin compositions forming insulating resin binders and insulating adhesive layers were respectively prepared with the formulas shown in Table 1. In this case, the minimum melt viscosity of the resin composition was adjusted by the preparation conditions of the insulating resin composition. The resin composition forming the insulating resin binder was applied to a PET film with a film thickness of 50 μm using a bar coater, and this was dried for 5 minutes in an oven at 80° C. to form an insulating resin binder layer with the thickness La shown in Table 2 on the PET film. Similarly, an insulating adhesive layer was formed on the PET film with the thickness shown in Table 2.

TABLE 1

| | | (Part by mass) Composition | | | |
|---|---|---|---|---|---|
| | Composition table for COG | A | B | C | D |
| Insulating resin binder | Phenoxy resin (YP-50, Nippon Steel & Sumikin Chemical Co., Ltd.) | 50 | 45 | 40 | 37 |
| | Silica filler (Aerosil R805, Aerosil Japan) | 20 | 10 | 10 | 8 |
| | Liquid epoxy resin (jER828, Mitsubishi Chemical Corporation) | 25 | 40 | 45 | 50 |

TABLE 1-continued

| | | (Part by mass) Composition | | | |
|---|---|---|---|---|---|
| | Composition table for COG | A | B | C | D |
| | Silane coupling agent (KBM-403, Shin-Etsu Chemical Co., Ltd.) | 2 | 2 | 2 | 2 |
| | Thermal cationic polymerization initiator (SI-60L, Sanshin Chemical Industry Co., Ltd.) | 3 | 3 | 3 | 3 |
| Insulating adhesive layer | Phenoxy resin (YP-50, Nippon Steel & Sumikin Chemical Co., Ltd.) | | | 40 | |
| | Silica filler (Aerosil R805, Aerosil Japan) | | | 5 | |
| | Liquid epoxy resin (jER828, Mitsubishi Chemical Corporation) | | | 50 | |
| | Silane coupling agent (KBM-403, Shin-Etsu Chemical Co., Ltd.) | | | 2 | |
| | Thermal cationic polymerization initiator (SI-60L, Sanshin Chemical Industry Co., Ltd.) | | | 3 | |

Next, a mold was produced so that the disposition of the conductive particles in a plan view was the disposition shown in Table 2, and the center distance of the closest conductive particles in the repeating units thereof was 6 μm. Pellets of a known transparent resin were then fed into the mold in a molten state and then hardened by cooling so that the concavities formed a resin mold with the disposition shown in Table 2. Here, in Experimental Example 8, the disposition of the conductive particles was a hexagonal lattice arrangement (number density: 32000 particles/mm$^2$), and one lattice axis thereof was inclined by 15° with respect to the long-side direction of the anisotropic conductive film.

Metal-coated resin particles (Sekisui Chemical Co, Ltd., AUL703, average particle diameter: 3 μm) were prepared as conductive particles, and these conductive particles were used to fill the concavities of the resin mold. This was covered with the insulating resin binder described above and pressed at 60° C. and at 0.5 MPa to achieve bonding. The insulating resin binder was then peeled from the mold, and the conductive particles on the insulating resin binder were pressurized (pressing conditions: 60 to 70° C., 0.5 MPa) to press the particles into the insulating resin binder, thereby producing a film in which the conductive particles were embedded in the insulating resin binder in the state shown in Table 2. In this case, the embedded state of the conductive particles was controlled by the pressing conditions. As a result, in Experimental Example 4, the film shape was not maintained after the conductive particles were pressed, but in the other experimental examples, films in which conductive particles were embedded were successfully produced. In observations with a metallurgical microscope, concavities were observed as shown in Table 2 around the exposed portions of the embedded conductive particles or directly above the embedded conductive particles. Note that although both concavities around the exposed portions of the conductive particles and concavities directly above the conductive particles were observed in each of the experimental examples excluding Experimental Example 4, the measurement values for the cases in which concavities were most clearly observed for each experimental example are shown in Table 4.

By laminating an insulating adhesive layer on the side where the conductive particles were pressed on the film in which conductive particles were embedded, an anisotropic conductive film with a two-layer type of resin layer was produced. However, since the film shape was not maintained after the conductive particles were pressed in Experimental Example 4, further evaluations were not made.

Evaluation

The anisotropic conductive film of each experimental example was measured for (a) the initial conduction resistance and (b) the conduction reliability as follows. Results are shown in Table 2.

(a) Initial Conduction Resistance

The anisotropic conductive film of each experimental example was sandwiched between a glass substrate on a stage and an IC for conduction property evaluation on the pressing tool side, and the film was pressed while heating with a pressing tool (180° C., 5 sec) to obtain a connected object for evaluation. In this case, the thrust produced by the pressing tool was varied in the three stages of low (40 MPa), medium (60 MPa), and high (80 MPa) to obtain three types of connected objects for evaluation.

Here, the terminal patterns of the IC and glass substrate for conduction property evaluation corresponded to each other, and the sizes thereof were as described below. In addition, when connecting the IC and the glass substrate for evaluation, the long-side direction of the anisotropic conductive film and the short-side direction of the bumps were aligned.

IC for Conduction Property Evaluation
  Outer shape: 1.8×20.0 mm
  Thickness: 0.5 mm
  Bump specifications: size: 30×85 μm; distance between bumps: 50 μm; bump height: 15 μm Glass Substrate (ITO Wiring)
  Glass material: 1737F manufactured by Corning Inc.
  Dimensions: 30×50 mm
  Thickness: 0.5 mm
  Electrode: ITO wiring The initial conduction resistance of the obtained connected object for evaluation was measured and evaluated according to the following three stages of evaluation criteria.

Evaluation criteria for initial conduction reliability (there is no problem from a practical standpoint as long as the resistance is less than 2Ω)
  A: less than 0.4Ω
  B: not less than 0.4 and less than 0.8Ω
  C: not less than 0.8Ω

(b) Conduction Reliability

The connected object for evaluation produced in (a) was placed in a thermostatic chamber for 500 hours at a temperature of 85° C. and a humidity of 85% RH to perform a reliability test, and the conduction resistance thereafter was measured in the same manner as in the case of the initial conduction resistance and evaluated according to the following three stages of evaluation criteria.

Evaluation criteria for conduction resistance (there is no problem from a practical standpoint as long as the resistance is less than 5Ω)
  A: less than 1.2Ω
  B: not less than 1.2Ω and less than 2Ω
  C: not less than 2Ω

TABLE 2

|  |  | Experimental Example 1 | Experimental Example 2 | Experimental Example 3 | Experimental Example 4 | Experimental Example 5 | Experimental Example 6 | Experimental Example 7 | Experimental Example 8 |
|---|---|---|---|---|---|---|---|---|---|
| Resin composition | | A | B | C | D | A | A | A | A |
| Film shape after pressing of conductive particles | | OK | OK | OK | NG | OK | OK | OK | OK |
| Conductive particle diameter: D (μm) | | 3 | 3 | 3 | 3 | 3 | 3 | 3 | 3 |
| Disposition of conductive particles | | FIG. 1A | FIG. 1A | FIG. 1A | FIG. 1A | FIG. 5 | FIG. 7 | FIG. 4 | Hexagonal lattice |
| Center distance of closest conductive particles (μm) | | 6 | 6 | 6 | 6 | 6 | 6 | 6 | 6 |
| Thickness (μm) | Insulating resin binder layer ($L_a$) | 4 | 4 | 4 | 4 | 4 | 4 | 4 | 4 |
| | Insulating adhesive layer | 14 | 14 | 14 | 14 | 14 | 14 | 14 | 14 |
| | La/D | 1.3 | 1.3 | 1.3 | 1.3 | 1.3 | 1.3 | 1.3 | 1.3 |
| Minimum melt viscosity (Pa · s) | Insulating resin binder layer | 8000 | 2000 | 1500 | 800 | 8000 | 8000 | 8000 | 8000 |
| | Insulating adhesive layer | 800 | 800 | 800 | 800 | 800 | 800 | 800 | 800 |
| | Total melt viscosity | 1200 | 900 | 900 | 800 | 1200 | 1200 | 1200 | 1200 |
| Viscosity at 60° C. (Pa · s) | Insulating resin binder layer | 12000 | 3000 | 2000 | 1100 | 12000 | 12000 | 12000 | 12000 |
| Embedded state of conductive particles | | | | | | | | | |
| Embedding rate (100 × Lb/D)% | | >80 | >95 | >95 | — | >80 | >80 | >80 | >80 |
| Exposed diameter Lc (μm) | | <2.8 | <2.5 | <2.5 | — | <2.8 | <2.8 | <2.8 | <2.8 |
| Presence or absence of concavities | | Present | Present | Present | — | Present | Present | Present | Present |
| Maximum depth Le of concavities (Ratio with respect to conductive particle diameter D) | | <50% | <50% | <50% | — | <50% | <50% | <50% | <50% |
| Maximum diameter Ld of concavities (Ratio with respect to conductive particle diameter D) | | <1.3 | <1.3 | <1.3 | — | <1.3 | <1.3 | <1.3 | <1.3 |
| COG evaluation | | | | | | | | | |
| Thrust: low 40 MPa | Initial conduction resistance | A | A | A | — | A | A | A | B |
| | Conduction reliability | A | A | A | — | A | A | A | B |
| Thrust: medium 60 MPa | Initial conduction resistance | A | A | A | — | A | A | A | B |
| | Conduction reliability | A | A | A | — | A | A | A | B |
| Thrust: high 80 MPa | Initial conduction resistance | A | A | A | — | A | A | A | A |
| | Conduction reliability | A | A | A | — | A | A | A | A |

It can be seen from Table 2 that in Experimental Example 4 in which the minimum melt viscosity of the insulating resin binder was 800 Pa·s, it is difficult to form a film having concavities in the insulating resin binder in the vicinity of the conductive particles. On the other hand, it can be seen that in the experimental examples in which the minimum melt viscosity of the insulating resin binder was 1500 Pa·s or higher, convex portions can be formed in the vicinity of the conductive particles of the insulating resin binder by adjusting the conditions at the time of the embedding of the conductive particles, and that the resulting anisotropic conductive films have good conduction properties for COG. In addition, it can be seen that in Experimental Examples 1 to 7 in which the number density of the conductive particles is lower than in Experimental Example 8, which has a hexagonal lattice arrangement, anisotropically conductive connection can be performed at a lower pressure.

(c) Short Occurrence Rate

The anisotropic conductive films of Experimental Examples 1 to 3 and 5 to 8 were used to obtain connected objects for evaluation under connection conditions of 180° C. and 60 MPa for 5 seconds, using the following IC for evaluation, and the numbers of shorts of the obtained connected objects for evaluation were counted to determine the short occurrence rate as a ratio of the number of shorts counted with respect to the number of terminals of the IC for evaluation.

IC for evaluating the short occurrence rate (comb-shaped TEG (test element group, space: 7.5 μm)):
  Dimensions: 15×13 mm
  Thickness: 0.5 mm
  Bump specifications: size: 25×140 μm; distance between bumps: 7.5 μm; height: 15 μm The short occurrence rate is preferably lower than 50 ppm from a practical standpoint, and all of the anisotropic conductive films of Experimental Examples 1 to 3 and 5 to 8 yielded values of less than 50 ppm.

Note that when the conductive particles captured for each bump were measured for each experimental example excluding Experimental Example 4, at least 10 conductive particles were captured in each case.

Experimental Examples 9 to 16

Production of Anisotropic Conductive Film

For the anisotropic conductive films to be used in FOG connection, the effects of the resin composition of the insulating resin binder and the disposition of the conductive particles on the film forming capacity and conduction properties were investigated as follows.

Specifically, resin compositions for forming insulating resin binders and insulating adhesive layers were prepared with the formulas shown in Table 3, and anisotropic conductive films were produced in the same manner as in Experimental Example 1 using these resin compositions. The disposition of the conductive particles and the center distance of the closest particles are shown in Table 4. In Experimental Example 16, the disposition of the conductive particles was a hexagonal lattice arrangement (number density: 15000 particles/mm$^2$), and one lattice axis thereof was inclined by 15° with respect to the long-side direction of the anisotropic conductive film.

In the production process of this anisotropic conductive film, the film shape was not maintained in Experimental Example 12 after the conductive particles were pressed into the insulating resin binder, but the film shape was maintained in the other experimental examples. Therefore, the embedded state of the conductive particles was observed and measured with a metallurgical microscope for the anisotropic conductive films of the experimental examples excluding Experimental Example 12, and the following evaluation was further performed. The embedded state of conductive particles in each experimental example is shown in Table 4. The embedded state shown in Table 4 is a measurement value when the concavities of the insulating resin binder were measured most clearly for each experimental example, similarly as in Table 2.

Evaluation

The anisotropic conductive film of each experimental example was measured for (a) the initial conduction resistance and (b) the conduction reliability as follows. Results are shown in Table 4.

(a) Initial Conduction Resistance

The anisotropic conductive film obtained in each experimental example was cut down to 2 mm×40 mm, sandwiched between a glass substrate and an FPC for conduction property evaluation, and pressed while heating (180° C., 5 seconds) with a tool width of 2 mm to obtain a connected object for evaluation. In this case, the thrust produced by the pressing tool was varied in the three stages of low (3 MPa), medium (4.5 MPa), and high (6 MPa) to obtain three types of connected objects for evaluation. The initial conduction resistance of the obtained connected object for evaluation was measured in the same manner as in Experimental Example 1, and the measurement was evaluated in three stages under the following criteria.

FPC for Evaluation:
  Terminal pitch: 20 μm
  Terminal width/space between terminals: 8.5 μm/11.5 μm
  Polyimide film thickness (PI)/copper foil thickness (Cu) =38/8, Sn plating Non-Alkali Glass Substrate
  Electrode: ITO wiring
  Thickness: 0.7 mm Initial Conduction Resistance Evaluation Criteria
  A: less than 1.6Ω
  B: not less than 1.6Ω and less than 2.0Ω
  C: not less than 2.0Ω

(b) Conduction Reliability

The connected object for evaluation produced in (a) was placed in a thermostatic chamber for 500 hours at a temperature of 85° C. and a humidity of 85% RH, and then the conduction resistance was measured in the same manner as in the case of the initial conduction resistance. The measurement was evaluated in three stages under the following criteria.

Conduction Reliability Evaluation Criteria
  A: less than 3.0Ω
  B: not less than 3.0Ω and less than 4Ω
  C: not less than 4.0Ω

It can be seen from Table 4 that in Experimental Example 12 in which the minimum melt viscosity of the insulating resin binder was 800 Pa·s, it is difficult to form a film having concavities. On the other hand, it can be seen that in the experimental examples in which the minimum melt viscosity of the insulating resin layer was 1500 Pa·s or greater, concavities can be formed in the vicinity of the conductive particles of the insulating resin binder by adjusting the conditions at the time of the embedding of the conductive particles, and that the resulting anisotropic conductive films have good conduction properties for FOG.

(c) Short Occurrence Rate

The number of shorts of the connected object for evaluation for which the initial conduction resistance was measured was counted, and the short occurrence rate was determined from the counted number of shorts and the number of gaps of the connected object for evaluation. There is no problem from a practical standpoint as long as the short occurrence rate is less than 100 ppm.

The short occurrence rates were less than 100 ppm in all of Experimental Examples 9 to 11 and 13 to 16.

Note that when the conductive particles captured for each bump were measured for each experimental example excluding Experimental Example 12, at least 10 conductive particles were captured in each case.

TABLE 3

| | Composition table for FOG | (Part by mass) Composition | | | |
|---|---|---|---|---|---|
| | | E | F | G | H |
| Insulating resin binder | Phenoxy resin (YP-50, Nippon Steel & Sumikin Chemical Co., Ltd.) | 55 | 45 | 25 | 5 |
| | Phenoxy resin (FX-316ATM55, Nippon Steel & Sumikin Chemical Co., Ltd.) | | | 20 | 40 |
| | Bifunctional acrylate (A-DCP, Shin-Nakamura Chemical Co., Ltd.) | 20 | 20 | 20 | 20 |
| | Bifunctional urethane acrylate oligomer (UN-9200A, Negami Chemical Industrial Co., Ltd.) | 25 | 35 | 35 | 35 |
| | Silane coupling agent (A-187, Momentive Performance Materials Inc.) | 1 | 1 | 1 | 1 |
| | Phosphoric acid methacrylate (KAYAMER PM-2, Nippon Kayaku Co., Ltd.) | 1 | 1 | 1 | 1 |
| | Benzoyl peroxide (Nyper BW, NOF Corporation) | 5 | 5 | 5 | 5 |
| Insulating adhesive layer | Phenoxy resin (FX-316ATM55, Nippon Steel & Sumikin Chemical Co., Ltd.) | | 50 | | |
| | Bifunctional acrylate (A-DCP, Shin-Nakamura Chemical Co., Ltd.) | | 20 | | |
| | Bifunctional urethane acrylate oligomer (UN-9200A, Negami Chemical Industrial Co., Ltd.) | | 30 | | |
| | Silane coupling agent (A-187, Momentive Performance Materials Inc.) | | 1 | | |
| | Phosphoric acid methacrylate (KAYAMER PM-2, Nippon Kayaku Co., Ltd.) | | 1 | | |
| | Benzoyl peroxide (Nyper BW, NOF Corporation) | | 5 | | |

TABLE 4

| FOG evaluation | | Experimental Example 9 | Experimental Example 10 | Experimental Example 11 | Experimental Example 12 | Experimental Example 13 | Experimental Example 14 | Experimental Example 15 | Experimental Example 16 |
|---|---|---|---|---|---|---|---|---|---|
| Resin composition | | E | F | G | H | E | E | E | E |
| Film shape after pressing of conductive particles | | OK | OK | OK | NG | OK | OK | OK | OK |
| Conductive particle diameter: D (μm) | | 3 | 3 | 3 | 3 | 3 | 3 | 3 | 3 |
| Disposition of conductive particles | | FIG. 5 | FIG. 5 | FIG. 5 | FIG. 5 | FIG. 3 lattice | FIG. 7 | FIG. 4 | Hexagonal |
| Center distance of closest conductive particles (μm) | | 9 | 9 | 9 | 9 | 9 | 9 | 9 | 9 |
| Thickness (μm) | Insulating resin binder layer ($L_a$) | 4 | 4 | 4 | 4 | 4 | 4 | 4 | 4 |
| | Insulating adhesive layer | 14 | 14 | 14 | 14 | 14 | 14 | 14 | 14 |
| | La/D | 1.3 | 1.3 | 1.3 | 1.3 | 1.3 | 1.3 | 1.3 | 1.3 |
| Minimum melt viscosity (Pa · s) | Insulating resin binder layer | 8000 | 2000 | 1500 | 800 | 8000 | 8000 | 8000 | 8000 |
| | Insulating adhesive layer | 800 | 800 | 800 | 800 | 800 | 800 | 800 | 800 |
| | Total melt viscosity | 1200 | 900 | 900 | 800 | 1200 | 1200 | 1200 | 1200 |
| Viscosity at 60° C. (Pa · s) | Insulating resin binder layer | 12000 | 3000 | 2000 | 1100 | 12000 | 12000 | 12000 | 12000 |
| Embedded state of conductive particles | | | | | | | | | |
| Embedding rate (100 × Lb/D)% | | >80 | >95 | >95 | — | >80 | >80 | >80 | >80 |
| Exposed diameter Lc (μm) | | <2.8 | <2.5 | <2.5 | — | <2.8 | <2.8 | <2.8 | <2.8 |
| Presence or absence of concavities | | Present | Present | Present | — | Present | Present | Present | Present |
| Maximum depth Le of concavities (Ratio with respect to conductive particle diameter D) | | <50% | <50% | <50% | — | <50% | <50% | <50% | <50% |
| Maximum diameter Ld of concavities (Ratio with respect to conductive particle diameter D) | | <1.3 | <1.3 | <1.3 | — | <1.3 | <1.3 | <1.3 | <1.3 |
| Thrust: low 3 MPa | Initial conduction resistance | A | A | A | — | A | A | A | B |
| | Conduction reliability | A | A | A | — | A | A | A | B |
| Thrust: medium 4.5 MPa | Initial conduction resistance | A | A | A | — | A | A | A | B |
| | Conduction reliability | A | A | A | — | A | A | A | B |
| Thrust: high 6 MPa | Initial conduction resistance | A | A | A | — | A | A | A | A |
| | Conduction reliability | A | A | A | — | A | A | A | A |

REFERENCE SIGNS LIST 1A, 1B, 1C, 1D, 1E, 1F, 1G, 1H, 1I, 1a, 1b, 1c, 1d, 1e Anisotropic conductive film
2, 2a, 2b, 2c, 2s Conductive particle
2m, 2n, 2o, 2p, 2q, 2r Row of conductive particle
2t Apical part of conductive particle
3 Insulating resin binder
3a Surface of insulating resin binder
3b, 3c Concavity
3p Tangential plane
4 Insulating adhesive layer
5, 5B Repeating unit
5a Edge parallel to long-side direction of anisotropic conductive film
5b Edge parallel to short-side direction of anisotropic conductive film
5x Polygon formed by successively connecting the centers of the conductive particles constituting the outer shape of the repeating unit
D: Average particle diameter
L1, L2 Circumscribing line
La Thickness of insulating resin binder
Lb Embedded amount of conductive particles
Lc Diameter of exposed portion of conductive particle
Ld Maximum diameter of concavity
Le, Lf Maximum depth

The invention claimed is:

1. An anisotropic conductive film comprising conductive particles disposed in repeating units in an insulating resin binder,
wherein each repeating unit includes the conductive particles arranged in single rows with spacing therebetween, adjacent rows in the unit having different numbers of conductive particles,
each repeating unit is defined by a polygonal shape formed by successively connecting centers of the conductive particles forming an outer shape of the repeating unit, and
the repeating units form an array of consecutive units in plan view having the same polygonal shape,
the repeating units are disposed in a lengthwise direction and a crosswise direction over an entire surface of the anisotropic conductive film, and
the anisotropic conductive film has regions in which no conductive particles are disposed between the repeating units in a long-side direction or a short-side direction of the anisotropic conductive film.

2. The anisotropic conductive film according to claim 1, wherein the numbers of conductive particles constituting the rows of conductive particles juxtaposed in the repeating units gradually differ.

3. The anisotropic conductive film according to claim 1, wherein the number of conductive particles constituting the central row of conductive particles is greater or less than the numbers of conductive particles constituting the rows of conductive particles on both sides.

4. The anisotropic conductive film according to claim 1, wherein each edge of the polygonal shape intersects diagonally with the long-side direction or the short-side direction of the anisotropic conductive film.

5. The anisotropic conductive film according to claim 1, wherein the polygonal shape has an edge parallel to the long-side direction or the short-side direction of the anisotropic conductive film.

6. The anisotropic conductive film according to claim 1, wherein the rows of conductive particles are parallel to one another in the repeating units.

7. The anisotropic conductive film according to claim 1, wherein single conductive particles are disposed repeatedly together with the repeating units.

8. The anisotropic conductive film according to claim 1, wherein a closest distance between adjacent conductive particles in the repeating units is not less than 0.5 times an average particle diameter of the conductive particles.

9. The anisotropic conductive film according to claim 1, wherein the conductive particles constituting the repeating units are disposed such that conductive particles at prescribed lattice points are regularly distanced from a disposition in which conductive particles are present at each lattice point of a hexagonal lattice or a square lattice.

10. The anisotropic conductive film according to claim 1, wherein a minimum melt viscosity of the insulating resin binder is in a range of 1500 to 15000 Pa·s.

11. The anisotropic conductive film according to claim 1, wherein a minimum melt viscosity of the insulating resin binder at 60° C. is in a range of 3000 to 20000 Pa·s.

12. The anisotropic conductive film according to claim 1, further comprising an insulating adhesive layer laminated on the insulating resin binder,
wherein a minimum melt viscosity of the insulating adhesive layer is lower than a minimum viscosity of the insulating resin binder.

13. The anisotropic conductive film according to claim 1, wherein a diameter Lc of exposed portions of the conductive particles embedded in the insulating resin binder is in a range of 10 to 90% of an average particle diameter D of the conductive particles.

14. The anisotropic conductive film according to claim 1, further comprising concavities formed in the insulating resin binder directly above the conductive particles,
wherein a ratio (Le/D) of a maximum depth Le of the concavities around exposed portions of the conductive particles embedded in the insulating resin binder to an average particle diameter D of the conductive particles is less than 50%,
a ratio (Ld/D) of a maximum diameter Ld of the concavities around the exposed portions of the conductive particles to the average particle diameter D of the conductive particles is in a range of 100 to 150%, and
a ratio (Lf/D) of a maximum depth Lf of the concavities to the average particle diameter D of the conductive particles is in a range of greater than 0 to less than 10%.

15. The anisotropic conductive film according to claim 1, wherein a ratio (La/D) between a thickness La of the insulating resin binder and an average particle diameter D of the conductive particles is in a range of 0.6 to 10.

16. The anisotropic conductive film according to claim 1, wherein the size of the repeating unit in the long-side direction of the anisotropic conductive film is 30 μm or more.

17. The anisotropic conductive film according to claim 1, wherein the anisotropic conductive film has regions in which no conductive particles are disposed between the repeating units in the long-side direction and the short-side direction of the anisotropic conductive film.

18. A connection structure comprising:
the anisotropic conductive film according to claim 1;
a first electronic component; and
a second electronic component, wherein an anisotropically conductive connection is formed between the first electronic component and the second electronic component using the anisotropic conductive film.

19. A method for producing a connection structure of a first electronic component and a second electronic component, the method comprising performing thermocompression bonding on a first electronic component and a second electronic component via an anisotropic conductive film, wherein the anisotropic conductive film according to claim 1 is used as the anisotropic conductive film.

* * * * *